(12) United States Patent
Jorgensen et al.

(10) Patent No.: US 9,809,286 B1
(45) Date of Patent: Nov. 7, 2017

(54) FIN MOUNTING ASSEMBLY

(71) Applicants: Rachel Eileen Jorgensen, Oak View, CA (US); Christopher Robert Fallon, Oak View, CA (US)

(72) Inventors: Rachel Eileen Jorgensen, Oak View, CA (US); Christopher Robert Fallon, Oak View, CA (US)

( * ) Notice: Subject to any disclaimer, the term of this patent is extended or adjusted under 35 U.S.C. 154(b) by 0 days.

(21) Appl. No.: 15/295,644

(22) Filed: Oct. 17, 2016

(51) Int. Cl.
  *B63B 1/00* (2006.01)
  *B63B 35/00* (2006.01)
  *B63B 35/79* (2006.01)

(52) U.S. Cl.
  CPC ........ *B63B 35/793* (2013.01); *B63B 35/7909* (2013.01)

(58) Field of Classification Search
  CPC ... B63B 35/79; B63B 35/7926; B63B 35/793; B63B 2035/79
  USPC ............................................... 441/65, 74, 79
  See application file for complete search history.

(56) References Cited

U.S. PATENT DOCUMENTS

| | | | | |
|---|---|---|---|---|
| 4,804,347 A * | 2/1989 | Ross | .................... | B63B 35/793 114/357 |
| 5,934,962 A * | 8/1999 | Daum | ................... | B63B 35/793 114/140 |
| 6,247,985 B1 * | 6/2001 | Block | ..................... | B63B 19/00 114/127 |
| 6,991,504 B1 * | 1/2006 | English | ................. | B63B 35/793 114/127 |
| 2004/0248482 A1 * | 12/2004 | Larkin | ................ | B63B 35/7926 441/79 |
| 2007/0218788 A1 * | 9/2007 | Field | ..................... | B63B 35/793 441/79 |
| 2010/0173546 A1 * | 7/2010 | Yeh | ........................ | B63B 35/793 441/74 |
| 2010/0273373 A1 * | 10/2010 | Field | ..................... | B63B 35/793 441/79 |
| 2011/0039463 A1 * | 2/2011 | Hort | ...................... | B63B 35/793 441/79 |
| 2015/0291265 A1 * | 10/2015 | Longo | ............... | B29C 45/14008 441/74 |

* cited by examiner

*Primary Examiner* — Daniel V Venne
(74) *Attorney, Agent, or Firm* — Robert Z. Evora, Esq.

(57) ABSTRACT

A fin mounting assembly having a fin box and a cover plate. The fin mounting assembly has a fin box with an upper end that is substantially closed and a lower end that is open with an outer edge. An elongated recess is disposed substantially central along a first axis of the fin box that is adapted to receive and secure a base of a fin. The upper end of the fin box has a flange with an outer border. The flange has a gradually increasing wall height curvature along the first axis, beginning adjacent to the outer edge of the flange and a greatest wall height curvature at a flange central portion. The flange also has a slot cover wall that extends up and away from the flange along the first axis and positioned over the elongated recess. The slot cover wall has an increasing width thickness beginning at the outer edge of the flange that increases in width and has a largest width at a slot cover central portion. A cover plate has an outer border and is adapted to be attached to the outer edge of the fin box.

20 Claims, 21 Drawing Sheets

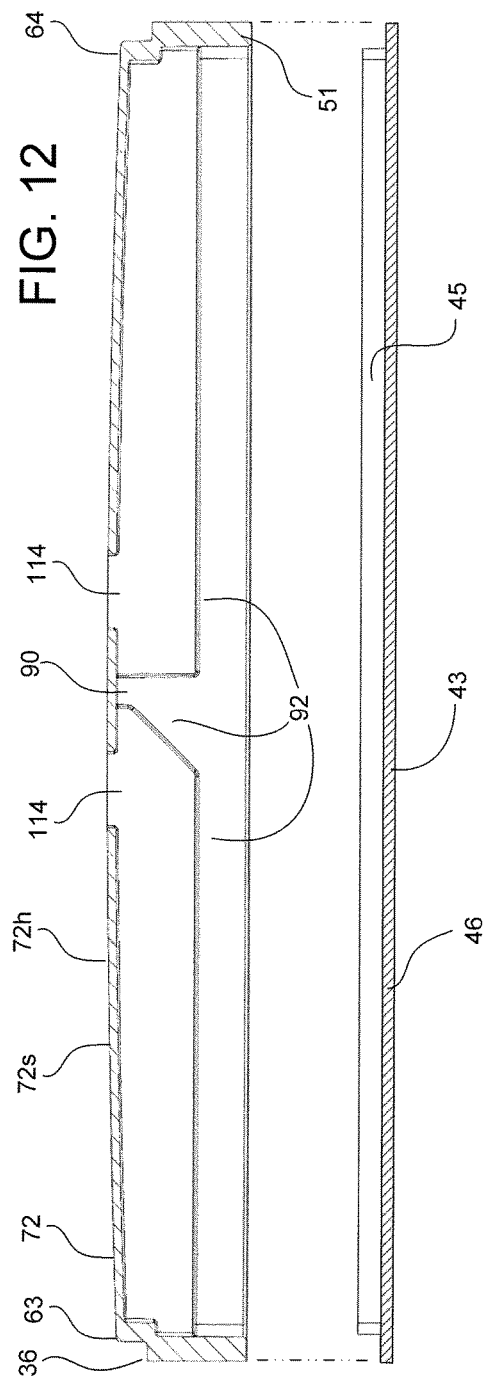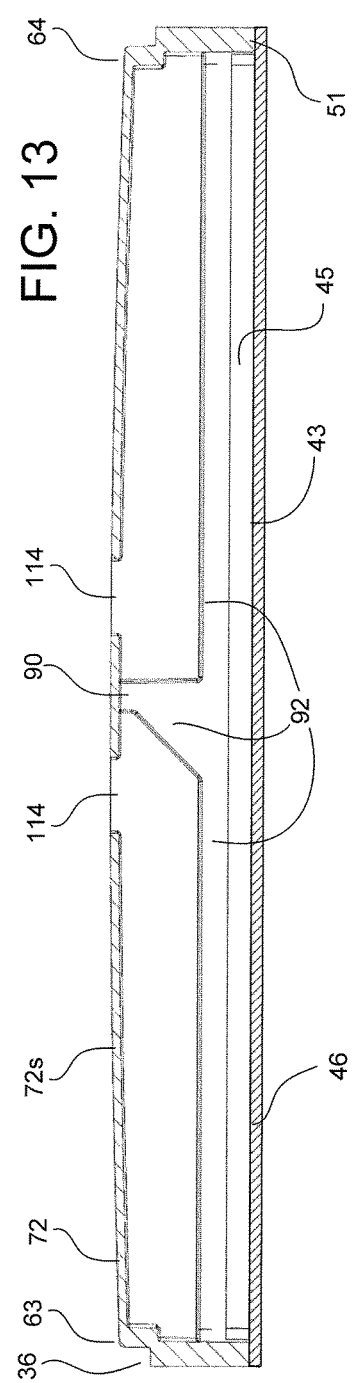

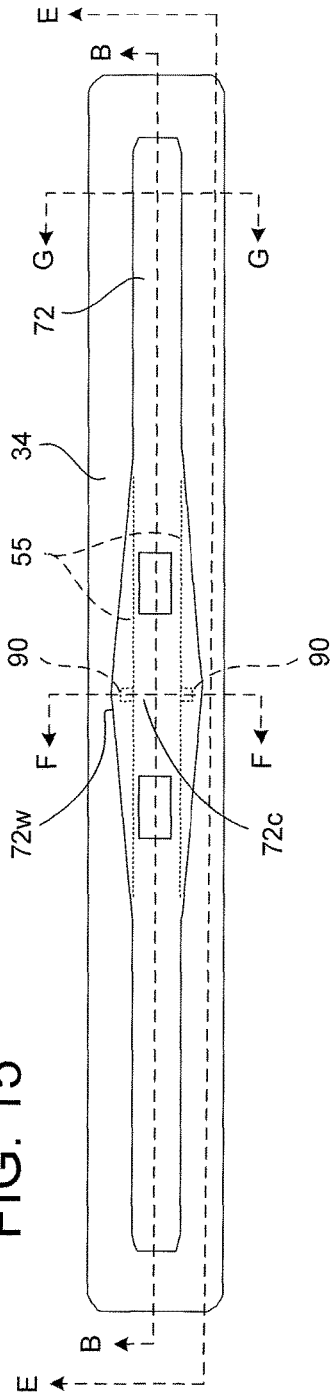
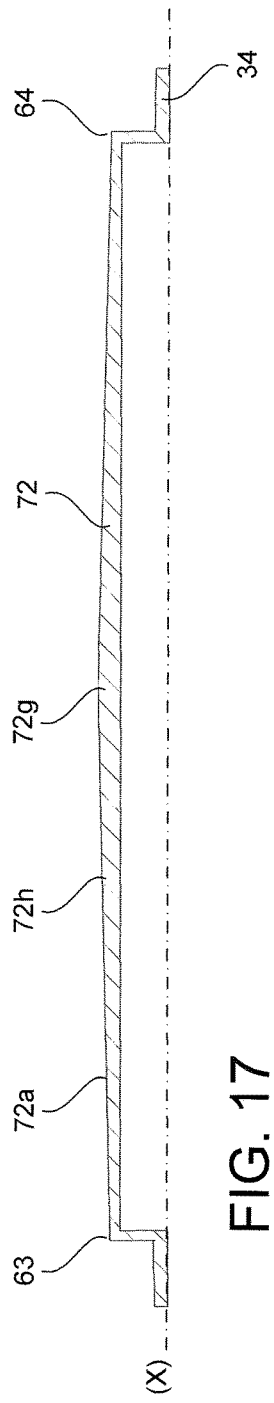
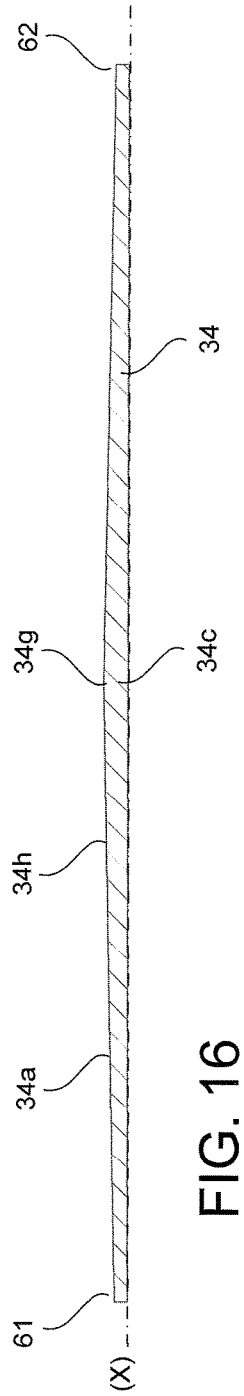
FIG. 15
FIG. 17
FIG. 16

FIN MOUNTING ASSEMBLY

TECHNICAL FIELD

The subject disclosure relates to a surfboard construction, and more particularly, to a fin mounting assembly for a foam core surfboard.

BACKGROUND

Surfing is a popular sport that has been a long enjoyed sport invented back in ancient Hawaii. Surfboards are constructed relatively light, but strong enough to support an individual standing on them while riding a breaking wave. Modern surfboards are made of polyurethane or polystyrene foam covered with layers of fiberglass cloth, and polyester or epoxy resin. The result is a light and strong surfboard that is buoyant and maneuverable. Recent developments in surfboard technology have included the use of carbon fiber. Likewise, the major advances over the years include the addition of one or more fins on the bottom rear of the board to improve directional stability, and numerous improvements in materials and shape. To provide the improved desired directional stability, a plurality of downwardly extending fins, generally from one to three, are attached to the rear underside of the surfboard. The attachment process has proven to be quite time consuming and tedious. Accordingly, there is a need for the development of a more efficient fin attachment method and assembly.

SUMMARY

A fin mounting assembly having a fin socket and a cover plate. The fin mounting assembly has a fin box having an upper end that is substantially closed and a lower end that is open with an outer edge. An elongated recess is disposed substantially central along a first axis of the fin box and is adapted to receive and secure a base of a fin. The fin box has a flange with an outer border and a slot cover wall. The slot cover wall extends away from the flange along the first axis and is positioned over the elongated recess. A cover plate has an outer border adapted to be attached to the outer edge of the open lower end of the fin box. The flange has a gradually increasing wall height curvature along the first axis beginning adjacent to the outer edge of the fin box near ends of the elongated recess and a greatest wall height curvature at a flange central portion.

When viewed in a planar view orthogonal to the first axis, the slot cover wall has a gradually increasing width thickness beginning at longitudinal ends of the slot cover wall. The width thickness gradually increases in width with a greatest width thickness at a slot cover central portion.

BRIEF DESCRIPTION OF THE DRAWINGS

Various exemplary embodiments of this disclosure will be described in detail, wherein like reference numerals refer to identical or similar components or steps, with reference to the following figures, wherein:

FIG. 12 is an exploded cross section view of the fin socket at cross section D-D in FIG. 8.

FIG. 13 is an assembled cross section view of the fin socket of FIG. 12.

FIG. 15 is a dimensioned top view of the fin socket showing openings in phantom lines.

FIG. 16 is a partial cross section view of a raised flange at cross section E-E in FIG. 15.

FIG. 17 is another exemplary partial cross section view of a slot cover wall at cross section B-B on FIG. 15.

DETAILED DESCRIPTION

Figure 1:
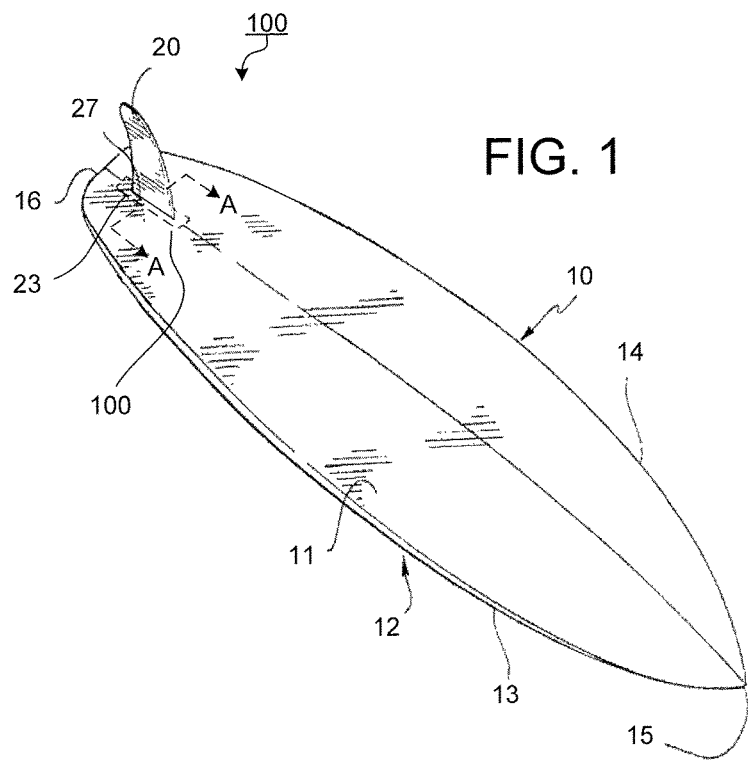
FIG. 1 illustrates a perspective underside view of a surfboard.

Particular embodiments of the present invention will now be described in greater detail with reference to the figures FIG. 1 illustrates a perspective underside view of a surfboard 10. The surfboard has a bottom surface 11, an upper surface 12 and edges 13, 14 which generally curve inwardly in the front portion of surfboard 10 to form a front end nose 15 or rounded end. Likewise, the edges 13, 14 generally curve and return inwardly to form a rear portion 16 of the surfboard 10. As shown, fin 20 extends generally upwardly from bottom surface 11. The fin may be of varying size and shape. The outer surfaces of fin 20 is joined to bottom surface 11 at junction 23 via a fin mounting system 100 according to this subject disclosure. It is to be understood that one or more fins may be attached to the board according to this subject disclosure.

Different from conventional fin mounts, the fin 20 of the fin mounting system 100 is aligned and secured to surfboard 10 in a generally secure and clean manner void of any sharp corners such that the bottom surface 11 is substantially even and undisturbed in the regions thereof adjacent to junction 23. The fin mounting system 100 is also constructed to account for the lower rocker 6 curve of a surfboard.

Figure 2:
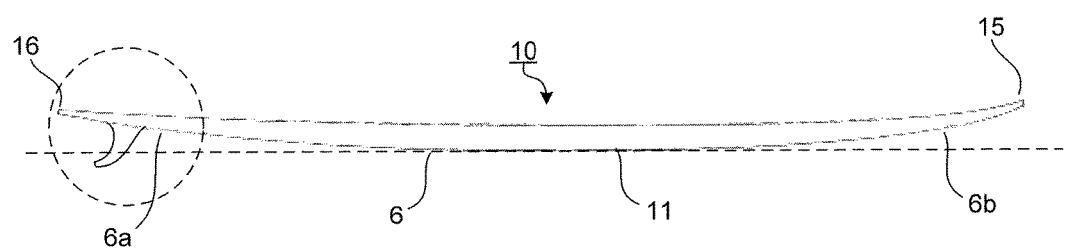
FIG. 2 is a side view of a surfboard illustrating a curved rocker.

FIG. 2 illustrates the rocker 6 of a surfboard 10 in a side view. The rocker 6 is the bottom curve on the bottom surface 11 of the surfboard 10 from the front end nose 15 to the tail or rear portion 16. A rear rocker 6a is disposed adjacent to the rear portion 16 of the bottom surface 11 can have a different curvature than the front rocker 6b adjacent to the rear portion 16 of the bottom surface 11 of the surfboard 10. As shown, it is the curvature of the surfboard 10 from a profile or side angle.

The purpose for this rocker 6 curve is to fit the surface area of the surfboard 10 to the curvature of a wave face. The amount of curve in the rocker 6 will affect the turning or carving ability of the surfboard 10. Performance shortboards typically have more rocker 6 to give a smaller turning radius. It is also more suitable for getting into steep and hollow waves. Surfboards 10 with low rocker 6 keep more surface area on top of the water, allowing the rider to generate more speed when paddling and surfing. This is in contrast to surfboards with more rocker 6, which have less surface area on the water and, thus, do not pick up speed as easily. For example, longboards are designed to catch waves with ease and typically have lower rocker 6 than shortboards. The low rocker 6 makes longboards more suitable for slow, mushy waves as opposed to steep hollow waves. The front rocker 6b at the front of the surfboard 10 may be different in curvature then the rear rocker 6a at the rear of the surfboard 10.

Figure 3:
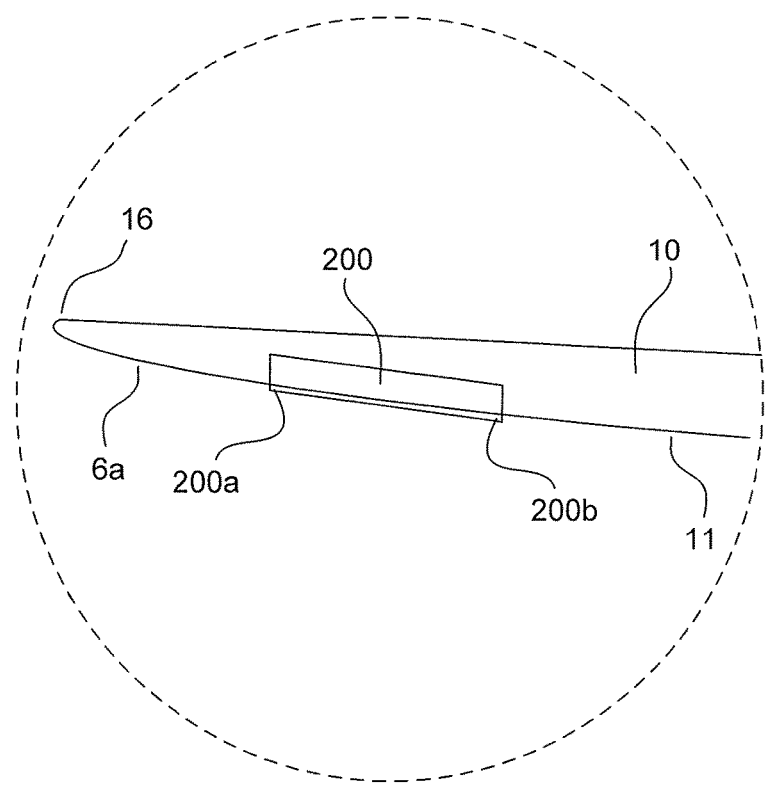
FIG. 3 is an exploded diagram of a conventional fin box positioned in a tail rocker of a surfboard.
Figure 4:
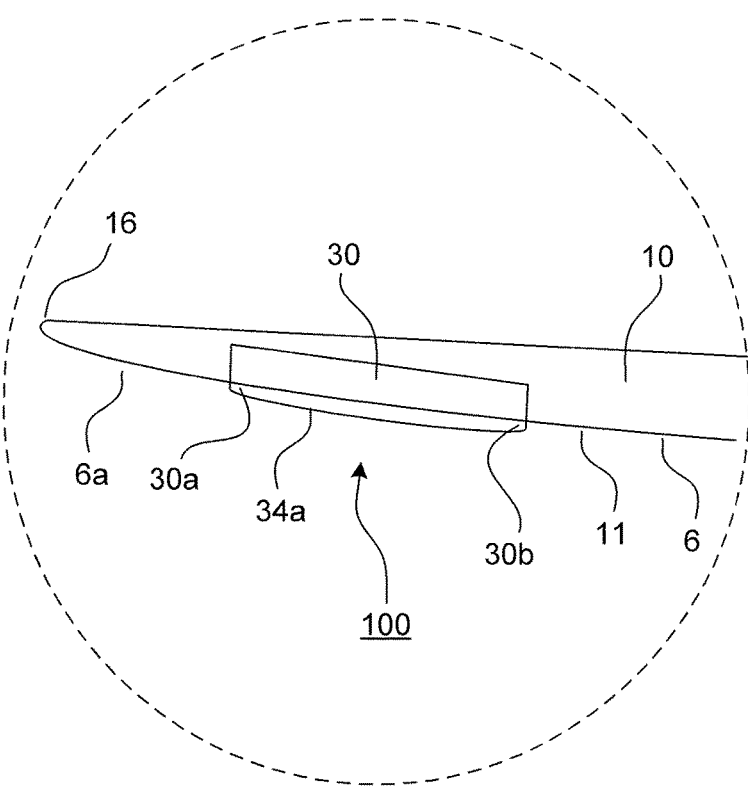
FIG. 4 is an exploded diagram of the fin socket according to this subject disclosure positioned in a tail rocker of a surfboard.

FIG. 3 shows a cumbersome use of a conventional fin mount 200 and FIG. 4 shows a fin socket 30 according to this subject disclosure. By comparison, since the surface protruding beyond the lower surface 11 of the surfboard conventional fin box 200 is straight, with sharp corners and does not account for the curvature of the rear rocker 6 of the surfboard 10, the ends 200a and 200b of the conventional fin box 200 extend outward away from the lower surface 11 of the surfboard 10 and are more difficult to cut the fiberglass laminations therearound.

In stark contrast and as shown in FIG. 4, the fin socket 30 of the fin mounting system 100 has a curvature of radius that generally follows the curvature of the rear rocker 6 of the surfboard and is substantially easier to cut down and match flush with the curvature of the lower surface 11 of the surfboard 10. As shown, the ends 30a and 30b of the fin socket 30 curve and lie substantially flush with the lower surface 11 of the surfboard 10. Unlike conventional fin mounts, the fin mounting system 100 of this subject application is constructed to work in coordination with, and account for the rocker 6 of the surfboard 10. As shown by comparison, traditional fin mounts (FIG. 3) were difficult to install as they did not account for the radius of curvature in the rocker 6 of a surfboard 10. The fin mounting system 100 of this subject disclosure (FIG. 4) is constructed with a curve in an upper surface 34a in an upper raised flange 34 that includes a gradual build up of a height of the wall defining a radius of curvature to account for the curve in a rocker 6.

Figure 5:
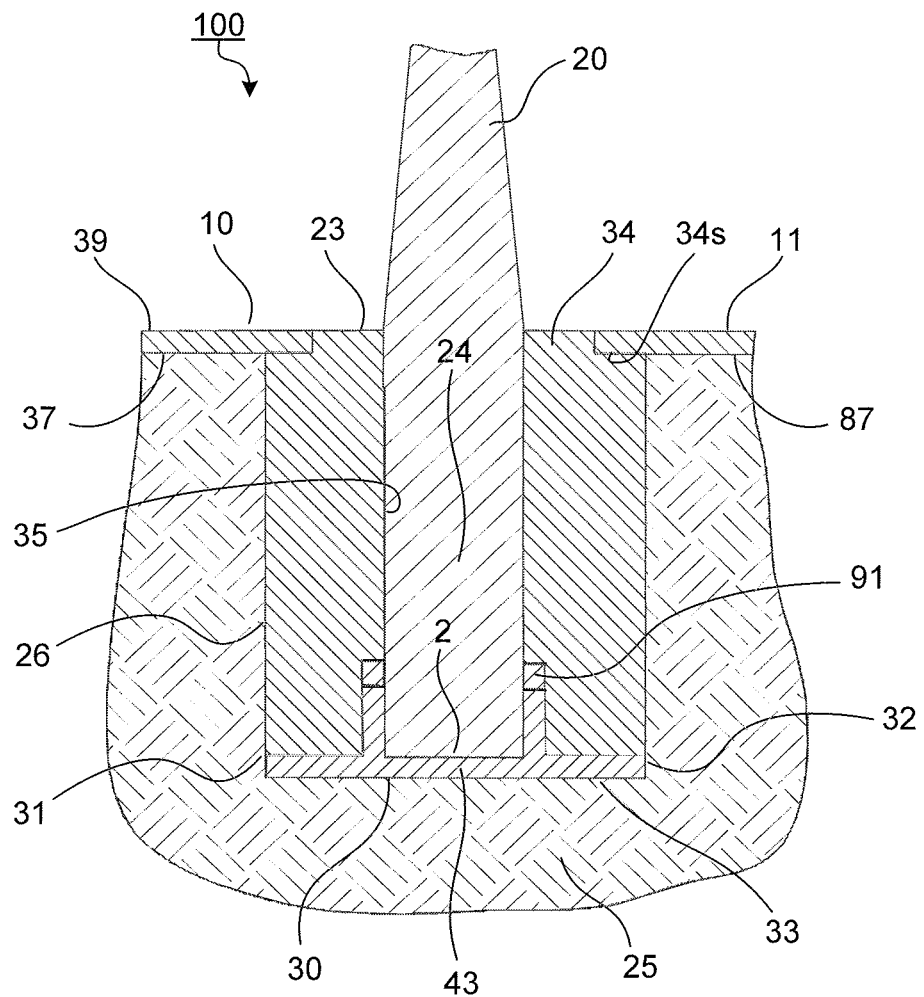
FIG. 5 is a cross section view of the fin mounting assembly at cross section A-A on FIG. 1.

FIG. 5 shows a partial cross section view of the fin socket 30 of the fin mounting system 100 and the fin 20 taken along section lines A-A in FIG. 1. A foam core 25 has a recessed opening 26 for a fin socket 30 disposed within the bottom surface 11 of the surfboard 10. The recessed opening 26 defines a generally rectangular contoured recess 26. The contoured recess 26 receives the fin socket 30 having a bottom surface 33 and a pair of side surfaces 31 and 32 which generally conform to contoured recess 26.

The fin socket 30 has a raised flange 34 that extends inwardly from sides 31 and 32 to junction 23. The fin socket 30 has an upwardly extending fin slot 35 which is closed at a lower end by a socket cover plate 43 and is open at its upper end and bordered by the raised flange 34. Alternatively, the raised flange 34 may include a plurality of upwardly extending rib portions (not shown) on its upper surface adapted to receive a resin lamination 39 there around for added mounting security within the resin laminations 39.

The resin lamination 39 may be constructed in accordance with conventional resin lamination techniques and may secure and extend across an upper surface 87 of foam core 25 as well as the upper surface 34s of raised flange 34. In application, the resin lamination 39 is bonded to the surface 87 of the foam core 25 and over the upper surface 34s of raised flange 34.

The fin 20 defines a generally rectangular fin base 24 configured to be snugly received within the elongated fin slot 35. The fin socket 30 may be bonded to and within the recess 26 by an adhesive layer (not shown). While the type of adhesive selected to secure fin socket 30 within contoured recess 26 and fin base 24 within fin slot 35 is to some extent a matter of fabricator's choice, one exemplary adhesive used may be an epoxy resin adhesive.

Figure 6:
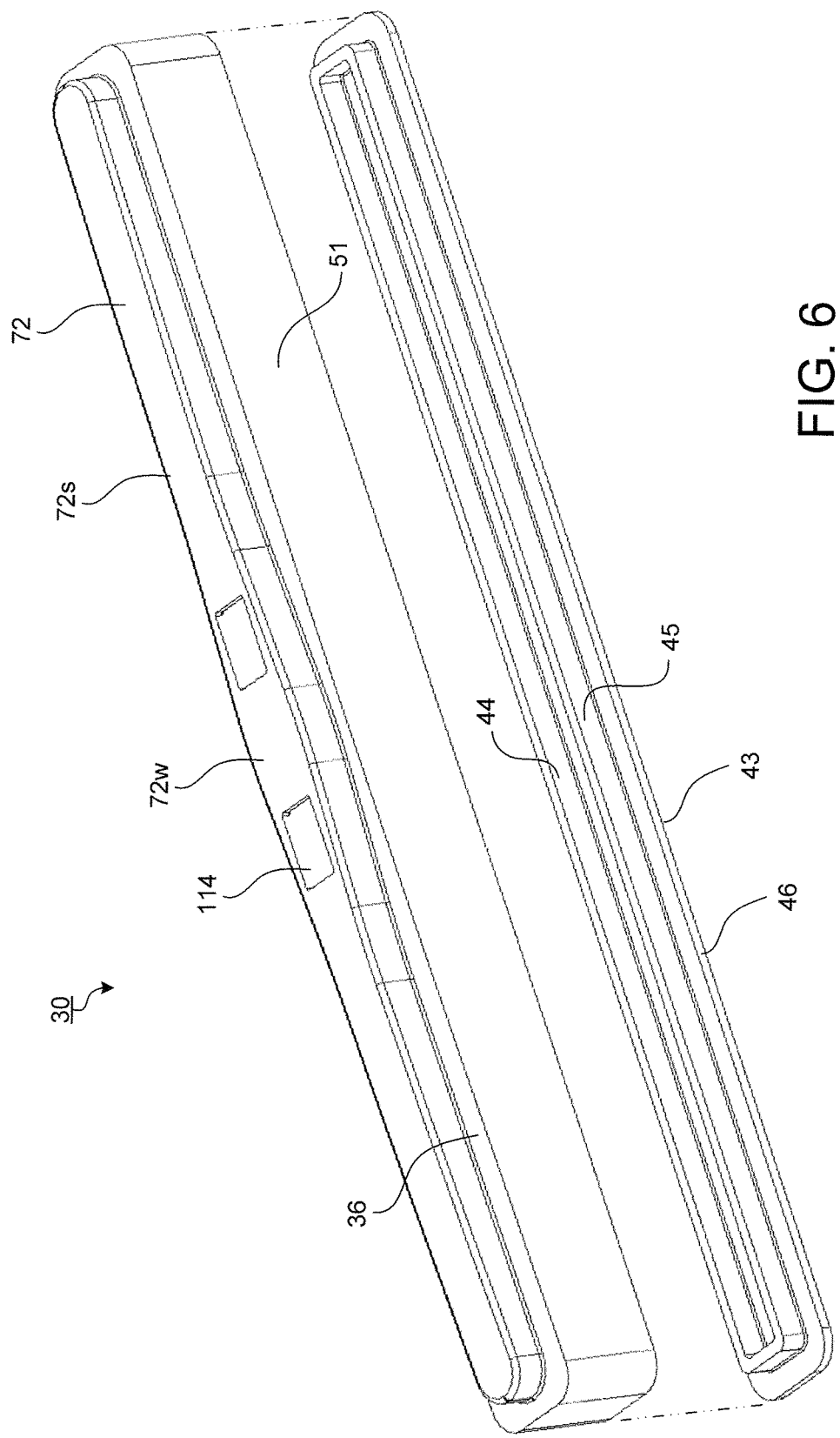
FIG. 6 is a perspective exploded view of the fin socket according to this subject disclosure.
Figure 7:
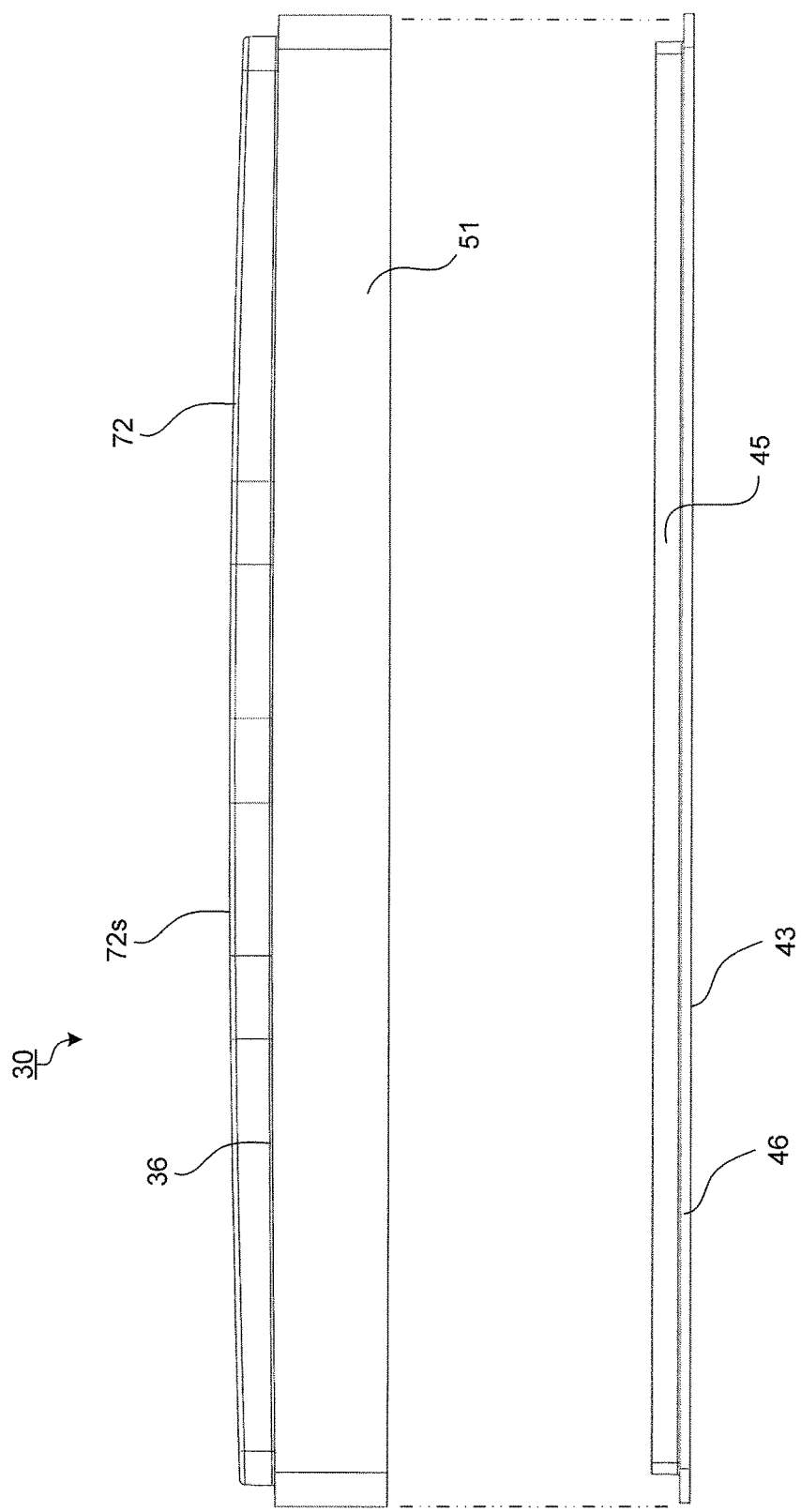
FIG. 7 is an exploded side view of the fin socket.
Figure 8:
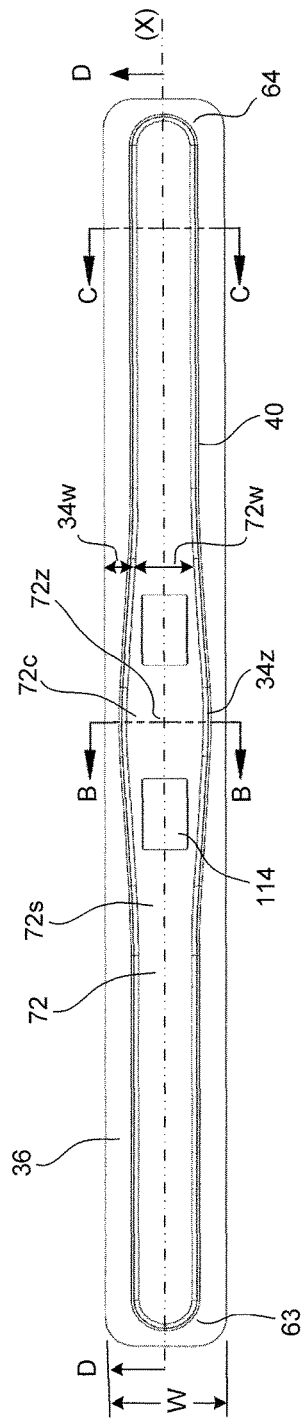
FIG. 8 is a top view of the fin socket.
Figure 11:
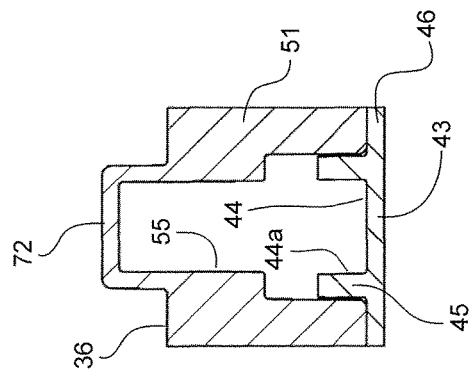
FIG. 11 is a cross section view of the fin socket at cross section C-C in FIG. 8.
Figure 10:
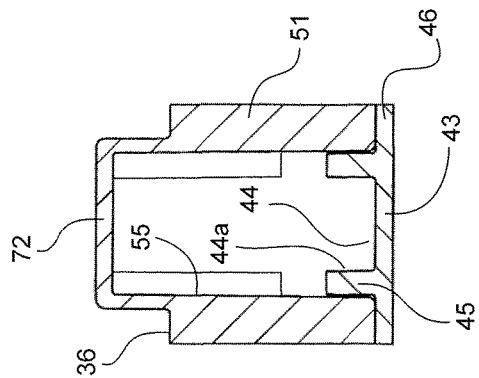
FIG. 10 is a cross section view of the fin socket at cross section B-B in FIG. 8.
Figure 9:
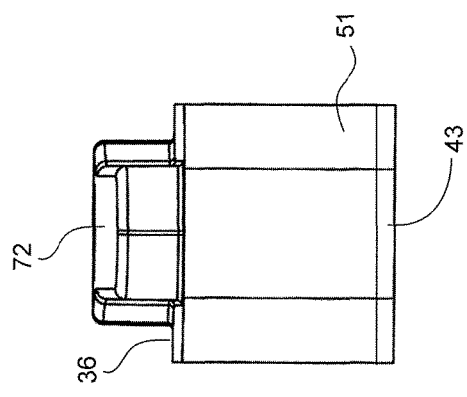
FIG. 9 is an end view of the fin socket.

FIGS. 6 and 7 depict a perspective exploded view and a side view of the fin socket 30 of the fin mounting system 100. FIG. 8 shows a top view of the fin socket 30 and FIG. 9 illustrates and a side view of the fin socket. FIGS. 10 and 11 show cross section views of the fin socket 30 at cross section lines B-B and C-C on FIG. 8. FIGS. 12 and 13 depicts and exploded and assembled cross section view of the fin socket 30 of the fin socket 30 taken at cross section lines D-D in FIG. 8.

The fin socket 30 structure includes a fin box or socket base 51 and a socket cover plate 43 disposed on a lower side thereof. The socket base 51 may be constructed as an inverted rectangular trough-like structure as shown in cross section in FIGS. 10 and 11. As shown in FIGS. 12-12 during assembly, the socket cover plate 43 is attached to a lower side of the socket base 51.

As shown in FIGS. 6-6 and 10-11, the socket cover plate 43 has an inner wall 45 disposed within a periphery of a base 46 of the socket cover plate 43 that projects upward into the socket base 51. The socket cover plate 43 has an inner channel 44 aligned with an inner recess 55 within the socket base 51 such that when assembled, an inner wall 44a within the inner channel 44 is aligned with the inner walls of the inner recess 55. The upper end of the inner recess 55 is bounded by a slot cover wall 72.

FIGS. 6, 8 and 12-13 show an upper surface 72s of the slot cover wall 72 having a pair of alignment openings 114 disposed in a widened portion of the upper surface 72s of the slot cover wall 72. The openings 114 are adapted to receive projections 112 from an alignment tool 110 as will be described in more detail later. The openings 114 may be used for a variety of different uses such as for sighting or setting a jig during the assembly process of the fin socket 30.

Figure 14:
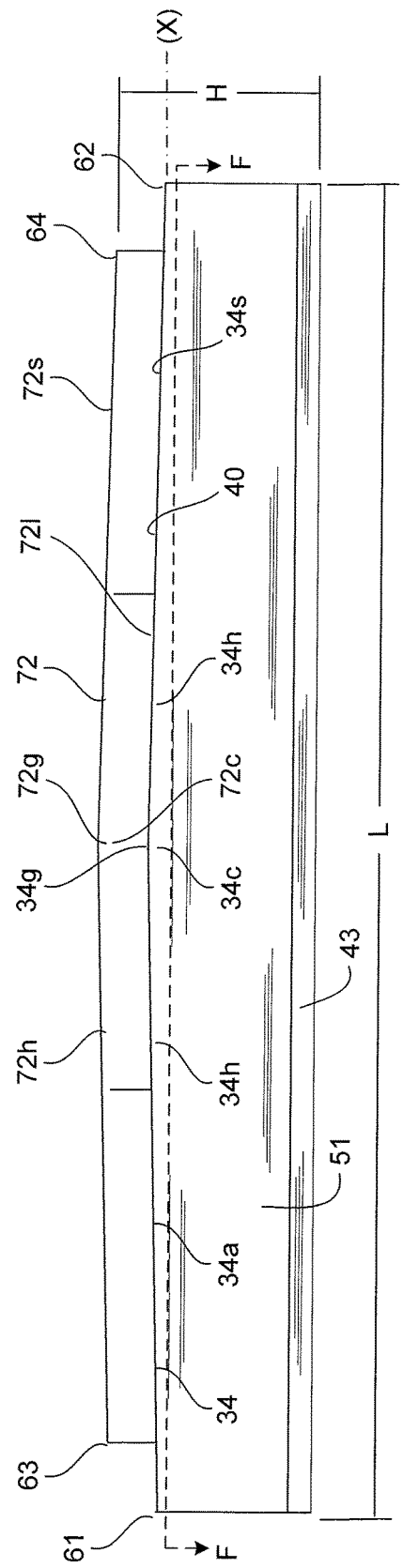
FIG. 14 is a side view of the fin socket showing the upwardly curved surfaces of the raised flange and the slot cover wall.

FIGS. 12-16 show the construction for the raised flange 34 and the slot cover wall 72 disposed on the socket base 51. As depicted in FIG. 14, an upper surface 34s of the socket base 51 illustrates the raised flange 34 straddling the slot cover wall 72. As shown, both the raised flange 34 and the slot cover wall 72 have upwardly curved upper surfaces 34s and 72s respectively.

In FIG. 16, the raised flange 34 is shown in cross section taken in FIG. 15 at cross section lines E-E. The raised flange 34 is constructed such that a wall height thickness 34h of wall 34a gradually increases along a first axis (X) from edges 61, 62 to a flange central portion 34c. The wall height thickness 34h of wall 34a begins thin or minimal adjacent to the outer edge 61, 62 of the raised flange 34 and increases in height inward toward a position located at a flange central portion 34c.

Likewise as shown in FIGS. 12-14, the raised closed slot cover wall 72 gradually curves upward in the direction of the first axis (X). The cover wall 72 begins at a lower height adjacent to the outer edges 63, 64 and increases in height toward a position located at a slot cover central portion 72c. At this slot cover central portion 72c position, the cover wall 72 is at a greatest height. As shown, the wall height thickness 72h of the cover wall 72 is constant along its length.

FIG. 17 shows that the slot cover wall 72 may be varied in thickness. That is, the wall height thickness 72h of the slot cover wall 72 may gradually increases in the direction of the first axis (X). The wall height thickness 72h of wall 72a of the raised closed slot cover wall 72 begins thin or minimal to increase adjacent to the outer edges 63, 64 of the raised closed slot cover wall 72 and increases in height inward toward a position located at a slot cover central portion 72c. At this slot cover central portion 72c position, the wall height 72h is a greatest slot wall height thickness 72g.

Figure 18:
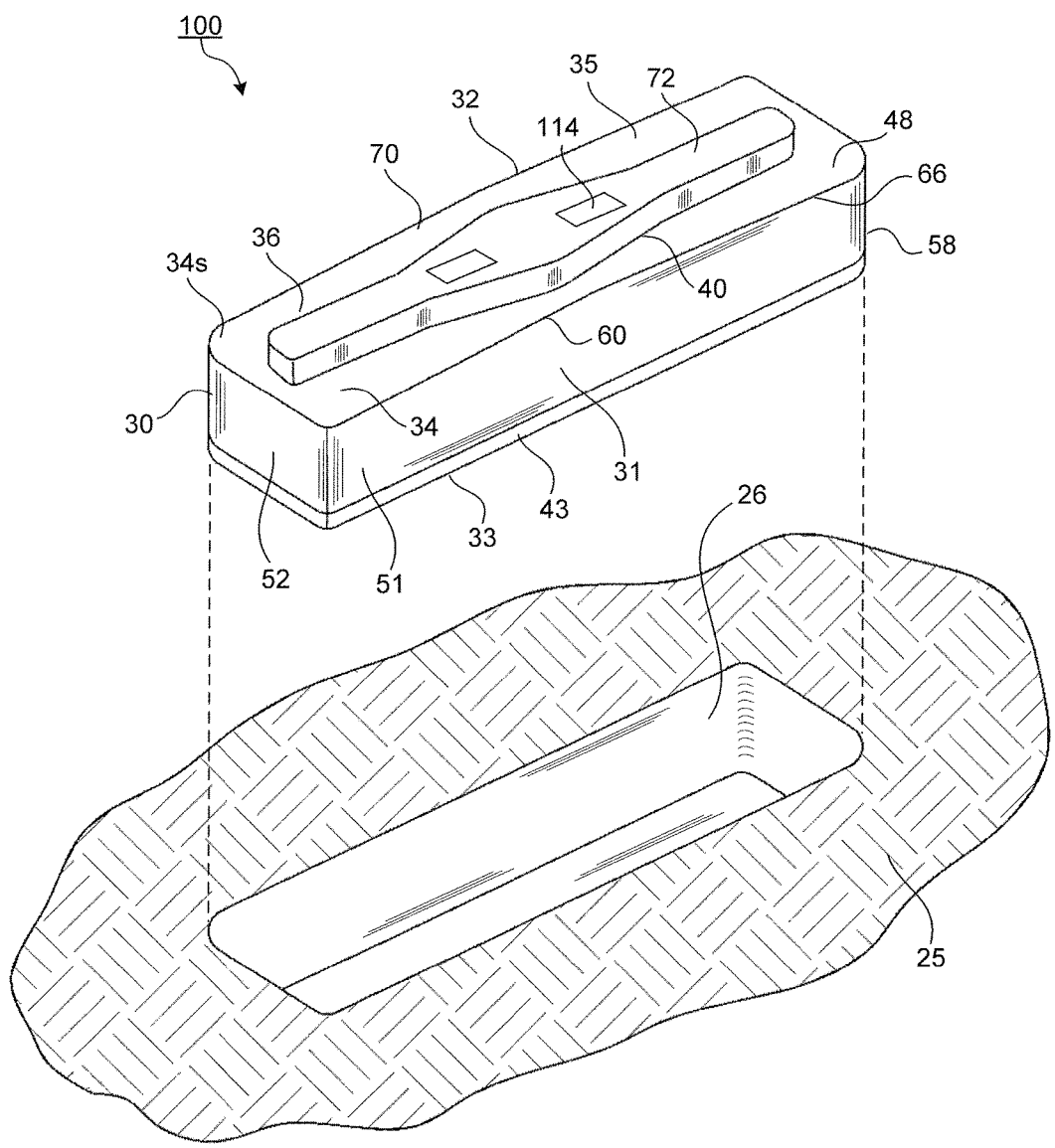
FIG. 18 is an exploded perspective view of the fin socket and a recess within a foam core of a surfboard.
Figure 19:
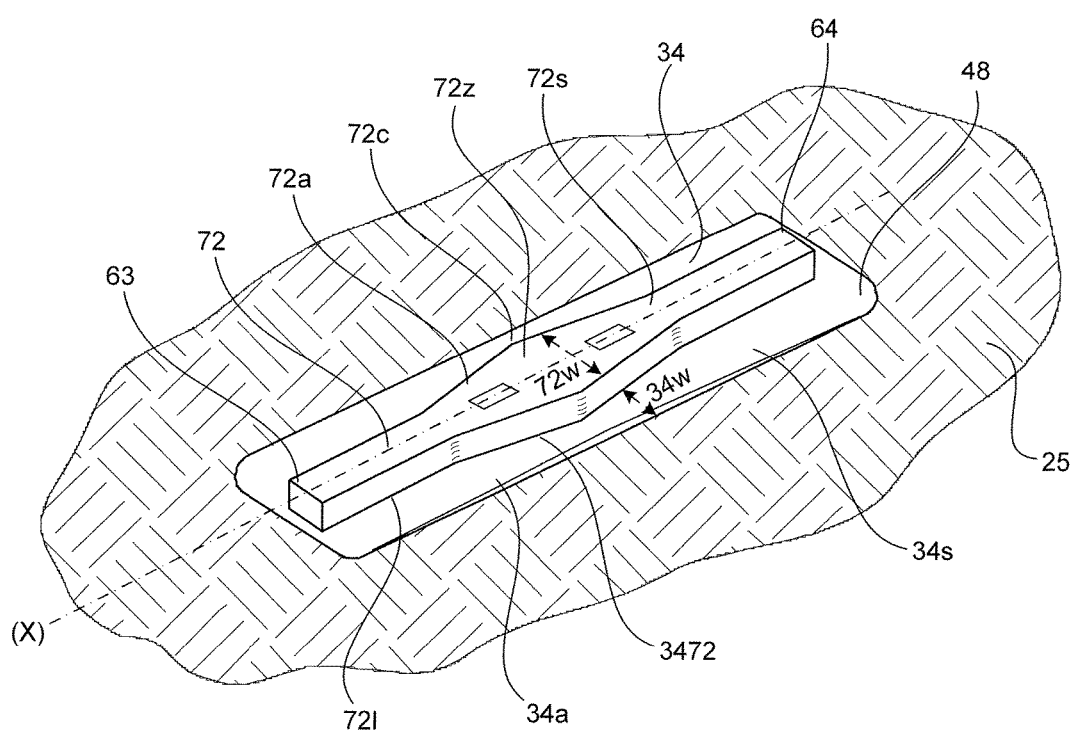
FIG. 19 is a perspective view of the fin socket disposed within the foam core of a surfboard.

FIGS. 18-19 illustrate a perspective exploded view of the fin socket 30 of the fin mounting system 100 and the fin socket 30 installed within the recess 26 of the foam core 25 as shown in FIG. 19. The cover plate 43 is attached to the socket base 51. The generally straight sides 31, 32 and flat end portions 52, 58 are positioned and secured within the recess 26 in the foam core 25. The sides 31, 32 and ends 52, 58 terminate on their upper portions at the upper surface 34s of the raised flange 34. In assembly, the socket base 51 has a substantially closed lower end 33 enclosed by the lower socket cover plate 43.

Figure 20:
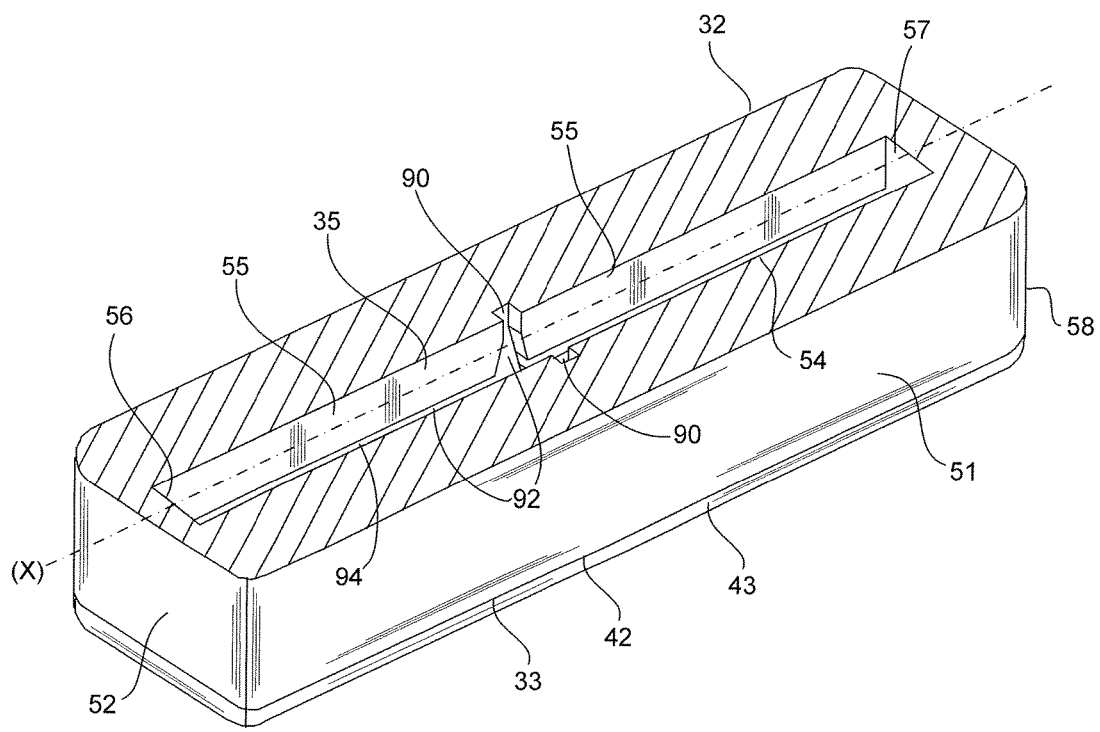
FIG. 20 is a cross section view of the fin socket at cross section F-F in FIG. 14.
Figure 21:
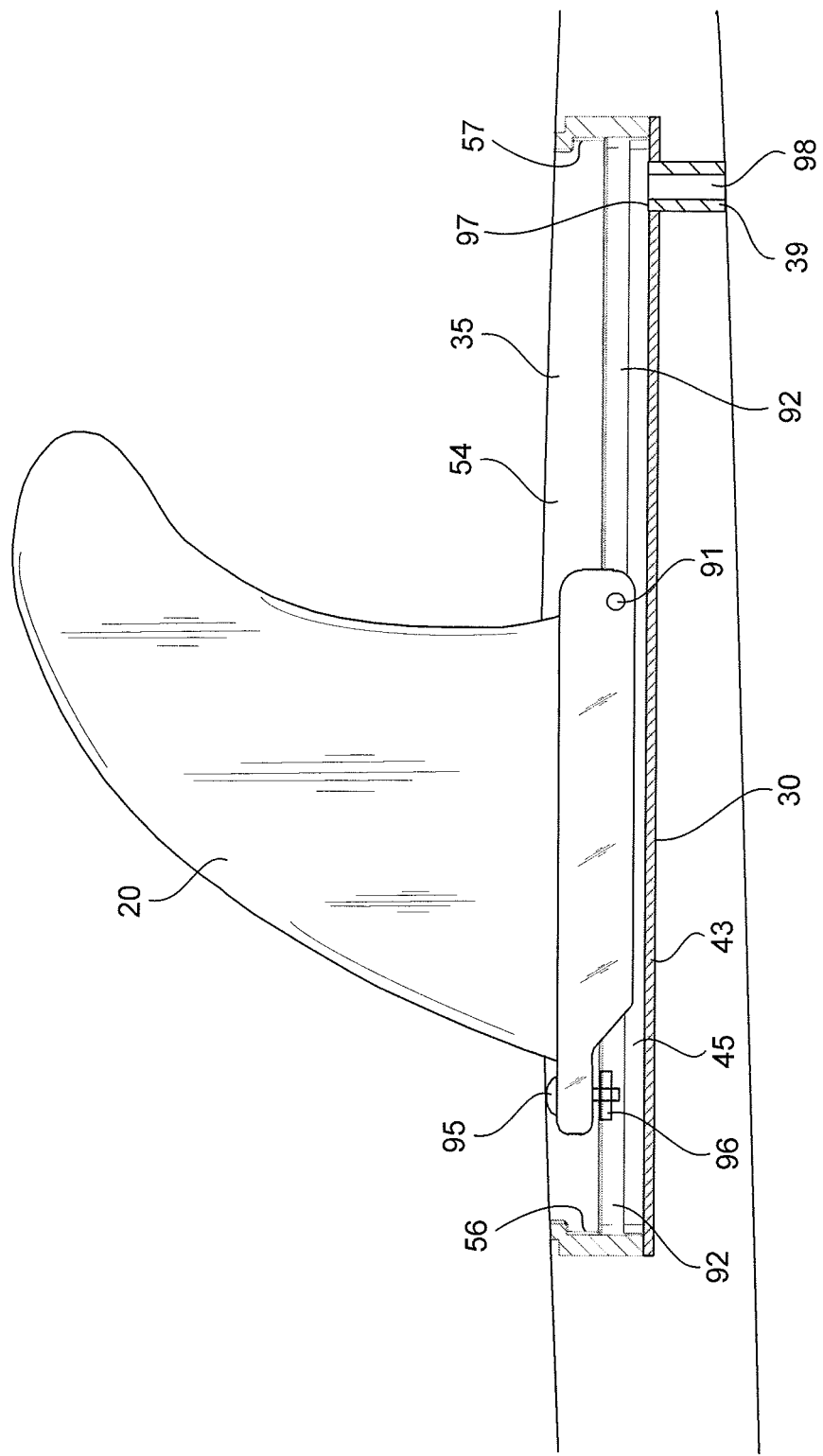
FIG. 21 is a partial side view of the fin socket assembled within the foam core of a surfboard.

FIG. 20 is a cross section view of at F-F on FIG. 14. This cross section location is just below the upper raised flange 34 portion of the raised flange portion 34 at the upper end of the fin socket 30. As shown in FIG. 20, the socket base 51 has an elongated recess 35 disposed substantially central along a first axis (X) that is adapted to receive and secure the fin base 24 of the fin 20 as shown in FIG. 21.

A pair of end walls 56 and 57, having a generally planar configuration, may be adapted to extend across the interior portions of sides 31 and 32 at the respective junctions of elongated sides 31 and 32 with ends 52 and 58. A pair of generally planar slot walls 54 and 55 are also provided to extend between, and are joined to end walls 56 and 57 in a parallel arrangement to form a fin slot 35. The interior structure of the combination of end walls 56 and 57 and slot walls 54 and 55 generally form the rectangular shaped fin slot 35 adapted to receive the fin base 24. The lower end of the socket base 51 is bounded by the cover plate 43. The cover plate 43 may be adapted to have a cooperative attachment with a lower surface 33 of the socket base 51 in a variety of different ways. That is, an upper surface 42 of the cover plate 43 corresponds to the lower surface 33 of the socket base 51 by a plurality of attachment methods, such as an adhesive, and/or other suitable secure bonding process.

It is to be understood that the socket cover plate 43 and the socket base 51 may be manufactured as a single integrated unit, or in two parts and assembled thereafter and connected to each other in a secure manner.

The fin socket 30 may include a plurality of elongated ribs disposed on an outer surface thereof in order to provide a more secure fit when the fiberglass laminations are laid over the fin socket and/or the fin socket is secured within the foam core 25 of the surfboard 10.

Referring back to FIGS. 14 and 16 in more detail, the raised flange 34 is described in more detail. The raised flange 34 is constructed such that a wall height thickness 34h of wall 34a gradually increases along the first axis (X) from the edge 61, 62 to the flange central portion 34c. As shown, the wall height thickness 34h of wall 34a begins thin or minimal adjacent to the outer edge 61, 62 of the raised flange 34 and increases in height inward toward a position located at a flange central portion 34c. At this central portion position 34c, the wall height thickness 34h is a greatest wall height thickness 34g.

Likewise, FIGS. 14 and 12-13 depict the slot cover wall 72 gradually increases in height the direction of the first axis (X). The slot cover wall 72 begins thin or minimal to increase adjacent to the outer edges 63, 64 of the raised closed slot cover wall 72 and curves upwardly in height inward toward a position located at a slot cover central portion 72c. At this slot cover central portion 72c position, the height of the slot cover wall 72 is a greatest at a central position 72c.

As mentioned previously, the slot cover wall 72 may be constructed in a variety of different shapes. As shown in FIGS. 14 and 17, the slot cover wall 72 may include a varying wall height thickness 72h that gradually increases in the direction of the first axis (X). That is, the wall height thickness 72h of wall 72a of the raised closed slot cover wall 72 begins thin or minimal to increase adjacent to the outer edges 63, 64 of the raised closed slot cover wall 72 and increases in height inward toward a position located at a slot cover central portion 72c. At this slot cover central portion 72c position, the wall height 72h is a greatest slot wall height thickness 72g.

The closed slot cover wall 72 has a gradually increasing wall width thickness 72w of wall 72a along the direction of the first axis (X) when viewed in a planar view, orthogonal to the axis (X). As shown, the wall 72a widens inward toward the slot cover central portion 72c in a direction orthogonal to the first axis (X) from longitudinal ends 63, 64 of the slot cover 72. That is, the wall width thickness 72w begins to increase outward from a thinner width at the longitudinal ends 63, 64 of the slot cover wall 72 and proceeds to widen outward in a gradual smooth manner. A greatest width thickness 72z of the wall 72a is provided at the slot cover central portion 72c. The widening of the wall width thickness 72w is gradual and void of any sharp edges.

As shown in FIGS. 8 and 19, an upper cover surface 72s of the slot cover wall 72 is located above an upper flange surface 34s of the raised flange 34. A lower end 721 of the slot cover wall 72 meets an upper flange surface 34s of the raised flange 34 at an edge defining a step 40.

The wall 34a of the raised flange 34 has an inverted flange wall width thickness 34w shape from the slot cover wall width thickness 72w as shown in FIG. 8. The wall 34a of the raised flange 34 butts up against the lower end of the slot cover 721 to define the step 40. That is, the shape of the flange wall width thickness 34w is inversely proportional to the slot cover wall width thickness 72w along the (X) axis. As shown, the raised flange 34 has a decreasing width thickness 34w beginning at longitudinal ends 61, 62 of the raised flange 34 and decreases in width thickness 34w toward a flange central portion 34c. The smallest width thickness 34z of the raised flange 34 being located at a flange central portion 34c.

It is to be understood that various smooth contoured shapes void of sharp corners may be constructed between the flange 34 and the slot cover wall 72 to define the shape of the junction or step 40 between the flange 34 and the slot cover wall 72 according to this subject disclosure.

The smooth contour of the shape of the step 40 at the junction between the flange 34 and the slot cover wall 72 is an advantage in that when the fiberglass laminations are laid onto the upper surface of the cover plate 36 over the raised flange 34 and butt up against the lower end 721 of the slot cover 72, excess fiberglass laminations may be cut away from the upper surface 34s of the cover plate 36 at the step 40 with ease and without having to cut around sharp edges that, in the past prior to this subject disclosure would conventionally poise gap and integrity issues in the fiberglass lamination which are caused as a result of non-straight fiberglass cuts which oftentimes result in premature or uneven shattering, splintering or splitting of the fiberglass laminations which will cause gaps in the laying of the fiberglass laminations over the fin socket 30. According to this subject disclosure, sharp edges are eliminated and clean flush fiberglass laminations may be cut in the region at the step 40, adjacent to the raised flange and the lower end 721 of the slot cover wall 72 thereby reinforcing the bond between the fiberglass laminations and the socket cover plate 36.

The increased width 72w of the upper surface of the slot cover wall 72 relative to the inverted proportionate thinner reduce width 34w of the raised flange 34 depicts a generally elongated diamond shaped according to this subject disclosure. The elongated diamond shape of the slot cover wall 72 is substantially built up in thickness and has thick curved edges to eliminate sharp corners. The advantage being that once the laminate resin has been laid over the fin socket 30 and cured, a grinder or sander is applied over the top of the diamond shaped slot cover wall 72 and ground down to reveal the fin slot being a smooth rounded surface free from sharp edges. Accordingly, premature or uneven shattering, splintering or splitting of the fiberglass laminations is prevented.

FIGS. 12-13, 15 and 20 illustrate openings 90 disposed within the elongated recess 55. As shown in FIG. 15, the increased wall width thickness 72w on the slot cover wall 72 disposed at approximately the central location 72c along the elongated recess 55 and the first axis (X) may be provided to account for the width of the openings 90. For example, as shown in partial phantom lines in FIG. 15 and solid in FIG. 20, the opening 90 may be provided in the elongated recess 55 of the socket base 51. The opening 90 may be disposed and extend substantially orthogonal to the axis (X) along the elongated recess 55 as also shown in FIGS. 12-13. The opening 90 substantially bisects the elongated recess 55 at a location that coincides with the greatest wall width thickness 72z at the slot cover central portion 72c (shown in FIG. 8).

FIGS. 5, 12-13 and 21 illustrate that opening 90 may be adapted to receive a post 91. The post 91 is connected to a base 24 of the fin 20. The opening 90 in the elongated recess 55 may be an opening to a track 92 (shown in FIGS. 12-13) adapted to receive the post 91 connected to the base 24 of the fin 20. The opening 90 may extend through a lower end 94 of the elongated recess 55 in the socket base 51.

During installation, the post 91 is connected to the base 24 of the fin 20. The fasteners 91 in the base 24 of the fin 20 are then aligned with the openings 90 in the socket base 51 and slid through the channel of the track 92 until the base 24 of the fin 20 is properly aligned within the elongated recess 55 as shown in FIGS. 5 and 21. Once the fin 20 is located in a preferred position, a threaded fastener 95 is attached to the fin 20 and a screw plate or captivating retainer 96 is positioned within the track 92. They are both positioned in alignment with each other once the fin 20 is located in a preferred position and then fastened to each other to securely attach the fin 20 in a desired position within the fin socket 30.

FIG. 21 shows that the length of the fin socket 30 according to this subject disclosure is longer than conventional shapes. The added length allows for a leash opening 97 of the surfboard 10 to be positioned within the fin socket 30. One exemplary method after the fin socket 30 has been secured within the surfboard 10 would be to drill a though hole 98 through the lower end of the base 46 of the socket cover plate 43 and through the foam core 25. A resin 39 would be poured into the through hole 98 and allowed to cure therein to create a waterproof seal with the foam core 25 and the fin socket 30 from surrounding areas where water exposure is possible. Another smaller drill hole is bored within the resin through hole 98 creating a waterproof seal. A leash may then be positioned and secured to the leash opening 97 constructed by the smaller drilled hole in the resin disposed within the through hole 98.

FIGS. 22-25 illustrate the use of a jig or alignment tool 110 for proper positioning of the fin socket 30 within the foam core 25 of the surfboard 10. The alignment tool 110 and the alignment openings 114, together substantially emulate the size and shape of the base 24 of a fin 20 when the base 24 of the fin 20 is secured within the recess 55 of the fin slot 35. The alignment tool 110 ensures proper alignment of the fin 20 in a preferred predetermined upright position and orientation during assembly attachment on the lower surface 11 of the surfboard 10.

Figure 24:
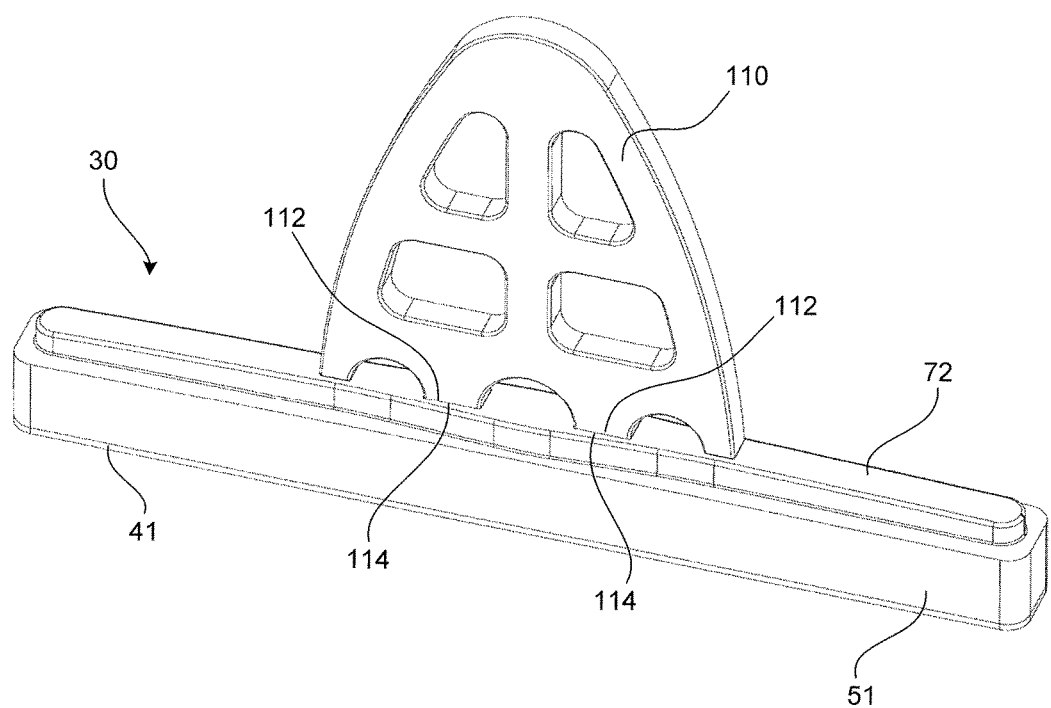
FIG. 24 is a perspective view of the alignment tool disposed within the fin socket for alignment.
Figure 26:
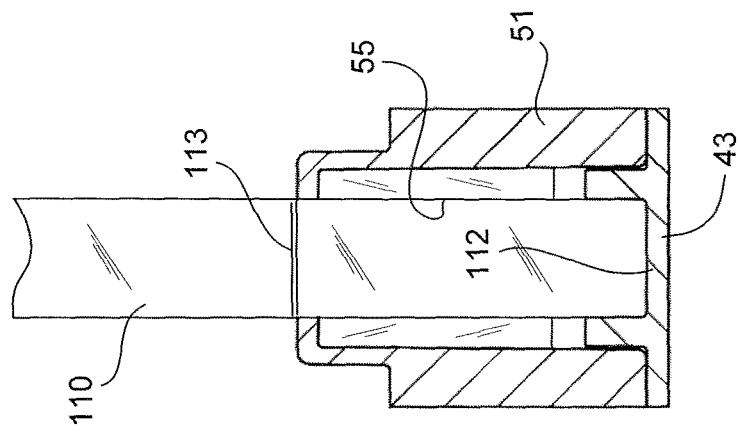
FIG. 26 is a partial side cross section view of the alignment tool disposed within the fin socket for alignment.
Figure 25:
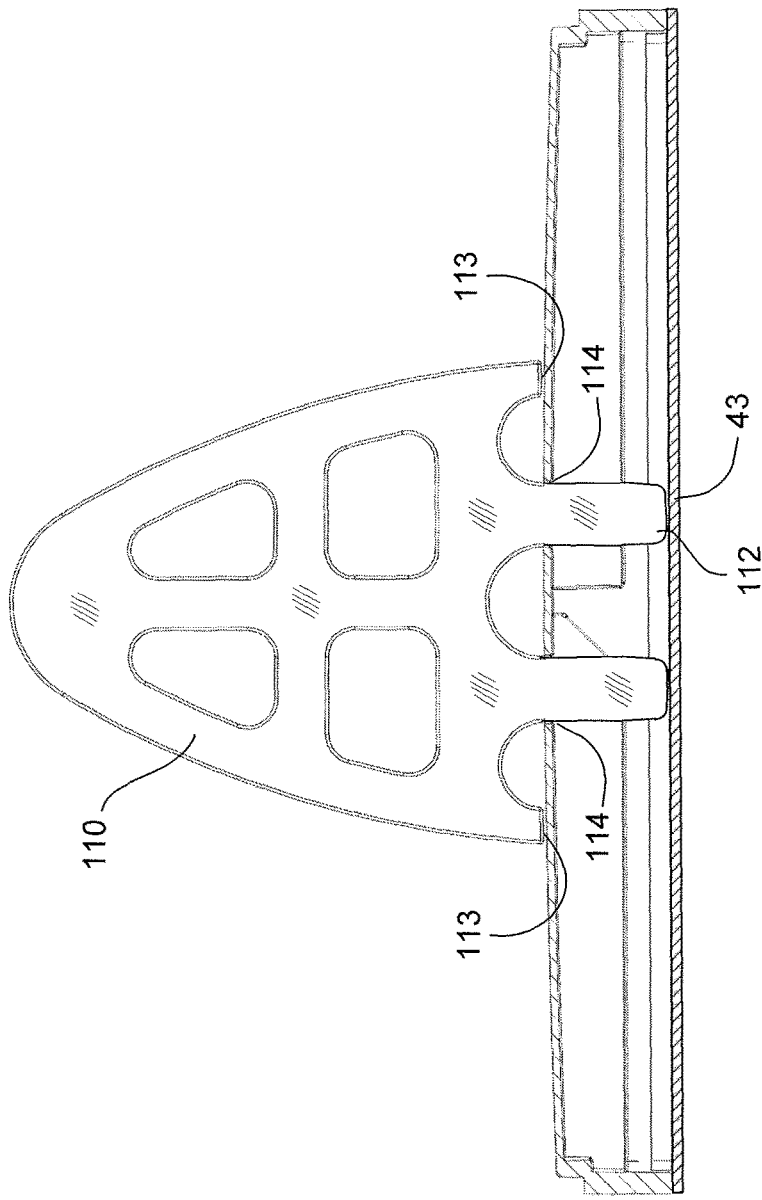
FIG. 25 is a partial front cross section view of the alignment tool disposed within the fin socket for alignment.

The alignment tool 110 has a pair of projections 112 that engage a pair of alignment openings 114 disposed in the slot cover wall 72 in order to align the fin socket 30 in a predetermined orientation and direction (as shown in FIGS. 24 and 25). A pair of alignment surfaces 113 are provided on the tool 110 to properly limit the distance that the projections 112 slide through the alignment openings 114.

Figure 23:
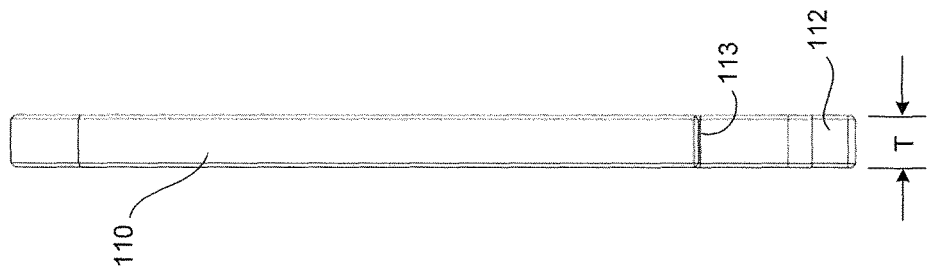
FIG. 23 is a side view of the alignment tool for the fin socket.
Figure 22:
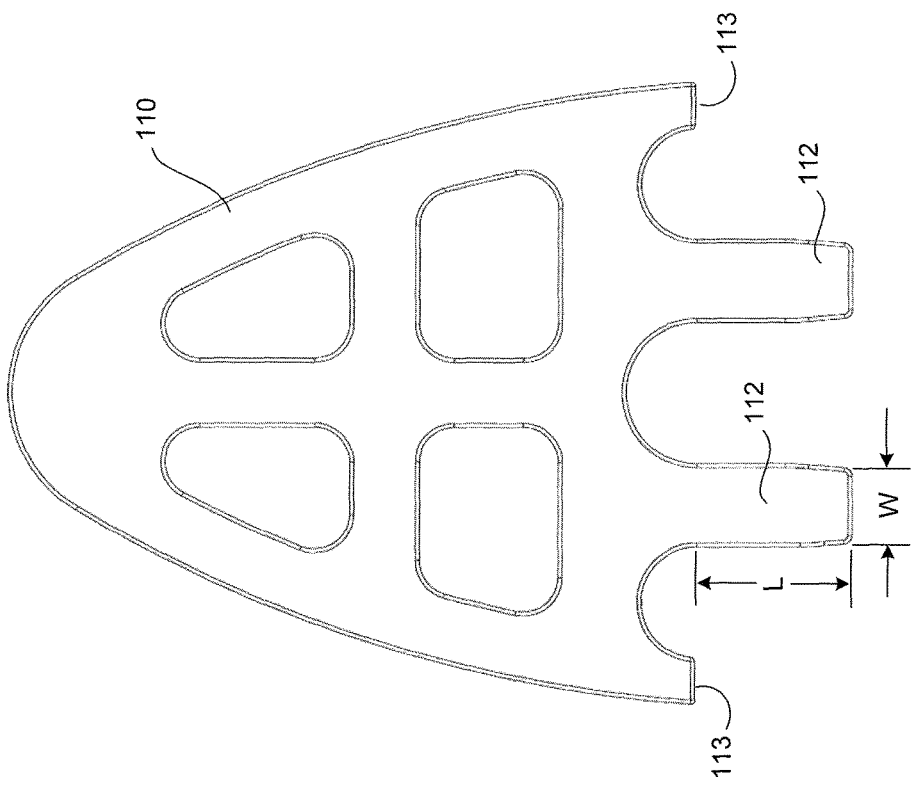
FIG. 22 is a front view of an alignment tool for the fin socket.

One or more projections 112 may be provided on the alignment tool 110 that correspond to one or more alignment openings 114 in the slot cover 72. The projections 112 are dimensioned to have a width (as shown in FIG. 22) that is the same width as the width of the alignment openings 114 so that there is little to no slop or play to accurately position the fin socket 30 within the core 25 of the surfboard 10. The projections 112 are also dimensioned to have a thickness (as shown in FIG. 23) that is the same thickness as the fin 20 inserted into the fin slot 35 so as to mimic the proper thickness when the fin 20 is assembled in the fin slot 35. Likewise, the projections 112 are dimensioned to have a length (as shown in FIG. 22) to extend into the recess 55 of the fin socket 20 to lie substantially adjacent to the socket cover plate 43 to resemble the actual length of the fin 20 when installed (as shown in FIG. 25). This construction is an advantage in that the alignment tool 110 substantially mimics the construction of a fin 20 that can be used during the assembly process without substantially or completely exposing the recess 55 further preventing fiberglass laminations from entering therein during the assembly process.

During the alignment process, a user may manipulate the alignment tool 110 to position the fin socket 30 in a preferred position and orientation for the fin socket 30 in preparation of the fiberglass laminations about to be applied to secure the fin socket 30 into place within the foam core 25 of the surfboard 10.

Referring back to FIGS. 6, 8 and 15, the smooth construction of the fin slot 30 by the elimination of sharp edges is an advantage in that the enhanced thickness over the raised flange and the slot cover wall 72 and the rounded edges serve the advantage of eliminating sharp or blunt edges when an upper end of the socket cover plate 36 is sanded down to reveal the recess 55 in the fin slot 35. The shape of a slight arc or radius of curvature that extends between their respective ends 61, 62 and 63, 64 of the elongated socket cover plate 36 and the slot cover wall 72 eliminates the sharp edges that were problematic in conventional constructions. The gradual arc in the raised flange 34 and the increased curvature in the slot cover wall 72 from the longitudinal edges 61, 62 of the raised flange 34 and the edges 63, 64 of the slot cover wall 72 to their central locations 34c, 72c respectively assist in providing these advantages. Likewise, the immediate peripheral edges or lip surrounding the thickening or build up of the walls 34a, 72a are rounded around their respective circumferences. The enhanced thickness and rounded edges serve the advantage of eliminating sharp edges when an upper end of the socket cover plate 36 is sanded down to reveal an opening slot or recess 55 for the fin 20. Furthermore, the radius of curvature in the thickening of height 34h, 72h of the walls 34a, 72a that defines the slight arc provides a thickness to account for curved contour in the rocker of a surfboard 10.

The smooth rounded edges between the upper surface 34s of the flange 34 and the lower surface 72l of the cover slot 72 make trimming the fiberglass laminations drastically more easy, useful and void of sharp edges, splintering, fraying or the like, as a cutting tool is able to cut along the rounded edge or step 40 with ease without having to make sharp turns along the step 40. Likewise, the additional thickness of the walls 34a, 72a provides the added structural stability when the material of the raised closed slot cover wall 72 on the socket cover plate 36 is sanded down revealing a flush elongated recess 55 adapted to receive the base 24 of the fin 20.

Figure 27:
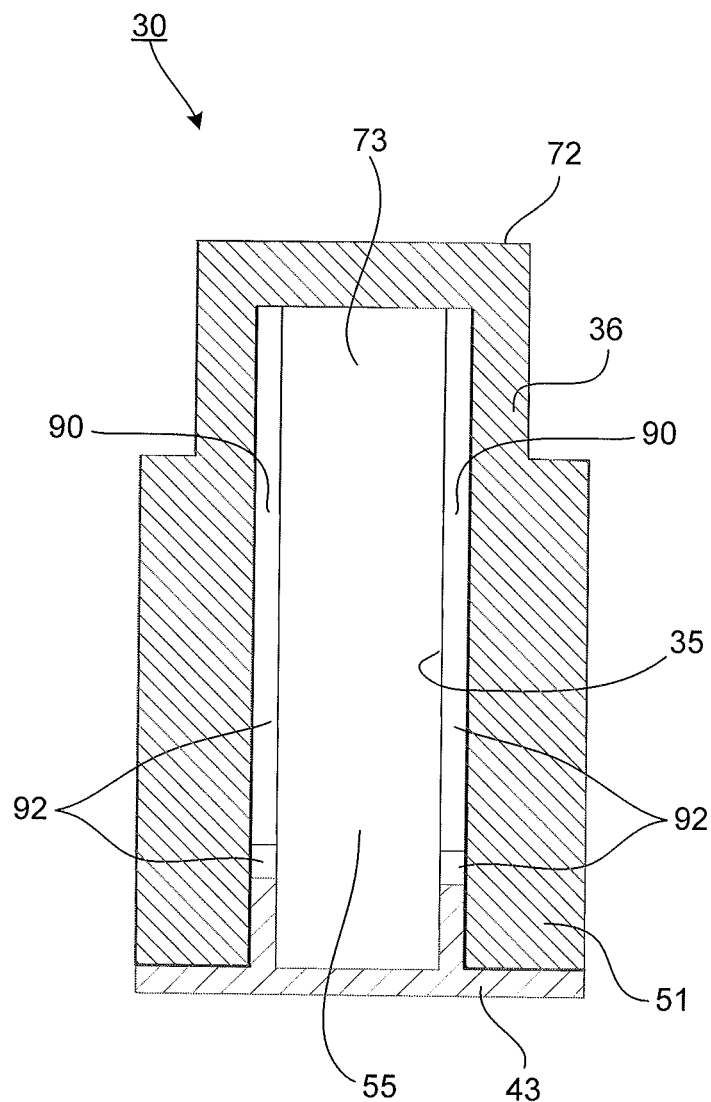
FIG. 27 is a cross section view of the fin socket.

FIGS. 27-31 demonstrate a method of making and installation of the fin mounting assembly 100 and resin laminations and the fin installation therein according to this subject disclosure. FIG. 27 shows a cross section view at F-F in FIG. 15. That is, the fin socket 30 has a closed slot cover 72 portion covering a socket base 51 at a central location. The socket base 51 defines a fin slot 35 disposed therein.

Figure 28:
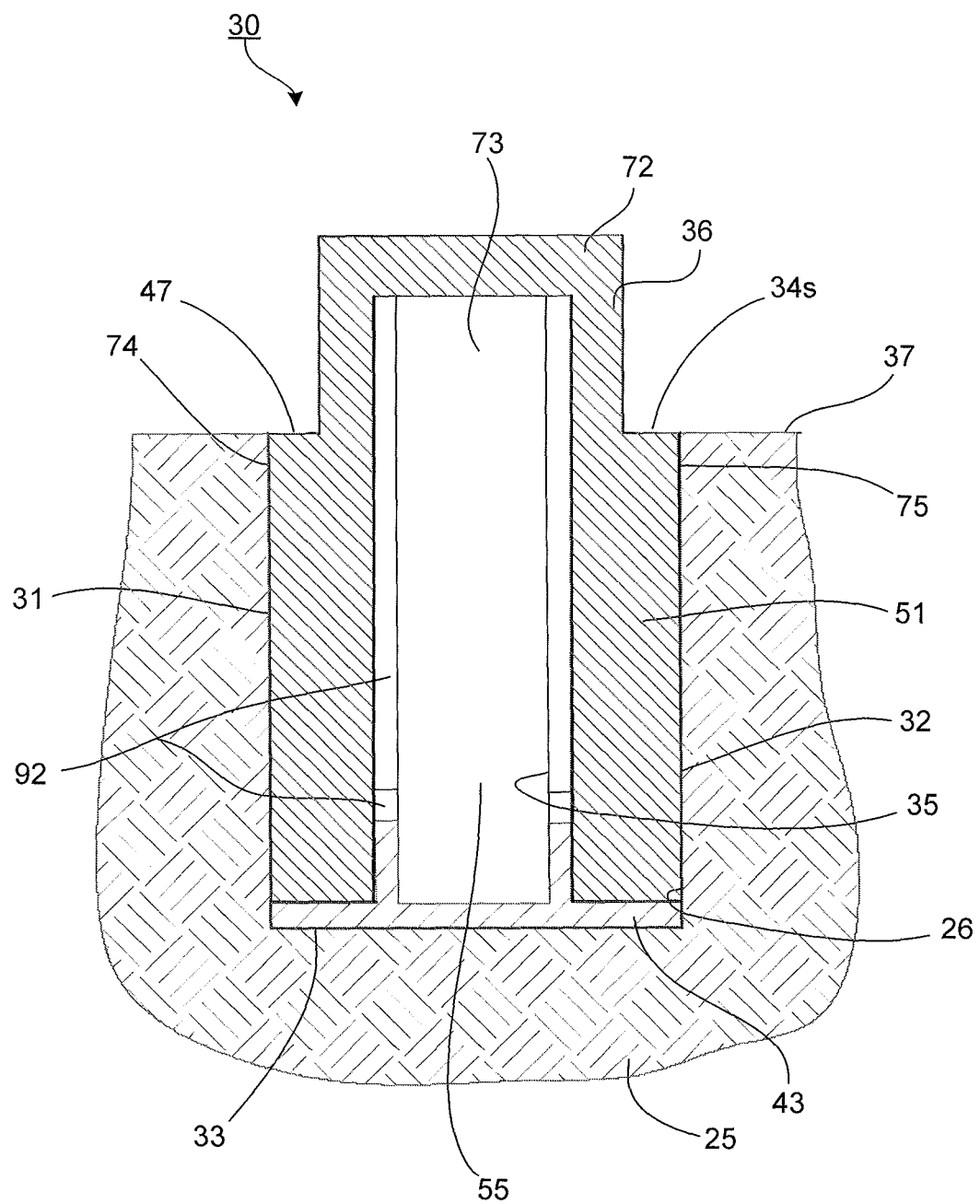
FIG. 28 is a cross section view of the fin socket disposed within a foam core of a surfboard.

FIG. 28 illustrates a cross section of the fin socket 30 positioned within a foam core 25. The fin socket 30 has a socket base 51 having a substantially open lower end attached to a socket cover plate 43, and an upper closed end bounded by a slot cover wall 72.

Figure 31:
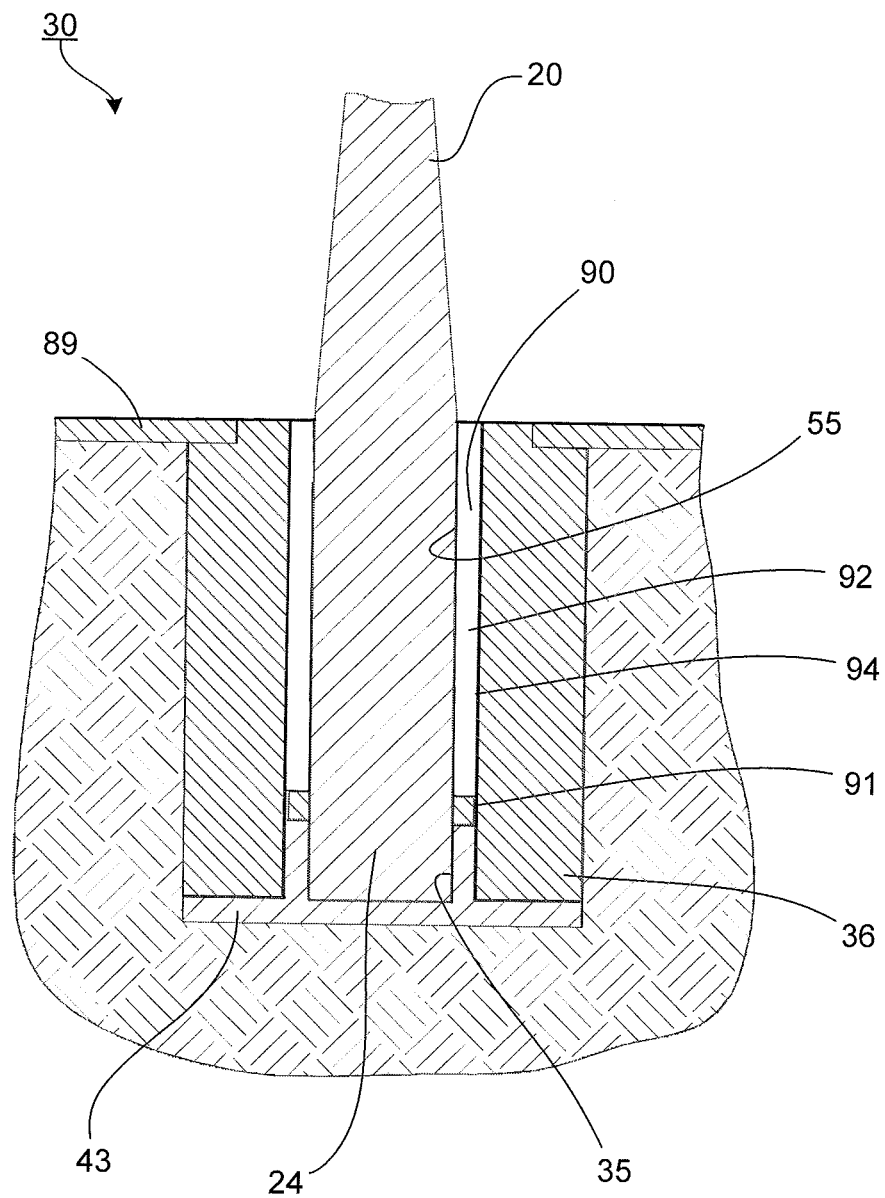
FIG. 31 is a cross section view of the base of a fin secured within the fin socket of FIG. 30.

The elongated recess 55 is disposed within an enclosure bounded by the socket cover plate 43 and the socket base 51 and disposed along the first axis (X) and is adapted to receive and secure a base 24 of a fin 20 as shown and discussed in more detail in FIG. 31.

In FIG. 28, the fin socket 30 is assembled within recess 26 of the foam core 25 of the surfboard 10. The fin socket 30 may be secured by coating the recess 26 with a suitable adhesive and firmly pressing the fin socket 30 into the recess 26 until the adhesive is cured. The resulting fin socket assembly 30 disposed within the foam core 25 is shown in FIG. 19.

Referring back to FIG. 28, the fin socket 30 is secured within recess 26 of the foam core 25 such that upper surface 34s of fin socket 30 is substantially flush with upper surface 37 of foam core 25. In position, the slot cover wall 72 has a radius of curvature that also extends above surface 34s of the raised flange 34. After installation as shown in FIGS. 19 and 28, the application of fiberglass lamination to the surfboard 10 is the next step as shown in FIG. 29.

As shown, the slot cover 72, which terminates the upper portion of recess 73, closes the resulting fin slot recess 55 thus formed at this point in the manufacturing process. Although the slot cover wall is shown closed to protect the interior of fin slot 35 during the laminating process to avoid undesired deposits of laminating resins therein, it is to be understood that the closed slot cover wall may be optional. Alternatively, the recess 73 may be fabricated without the closure of fin slot cover wall 72, for example, provided the surrounding walls of the recess 73 that extend upwardly from the surface 48 a substantial distance without a closed top slot cover wall 72 portion. Care is taken during the laminating process to prevent the spillage of the fiberglass laminations into the recess 55.

Figure 29:
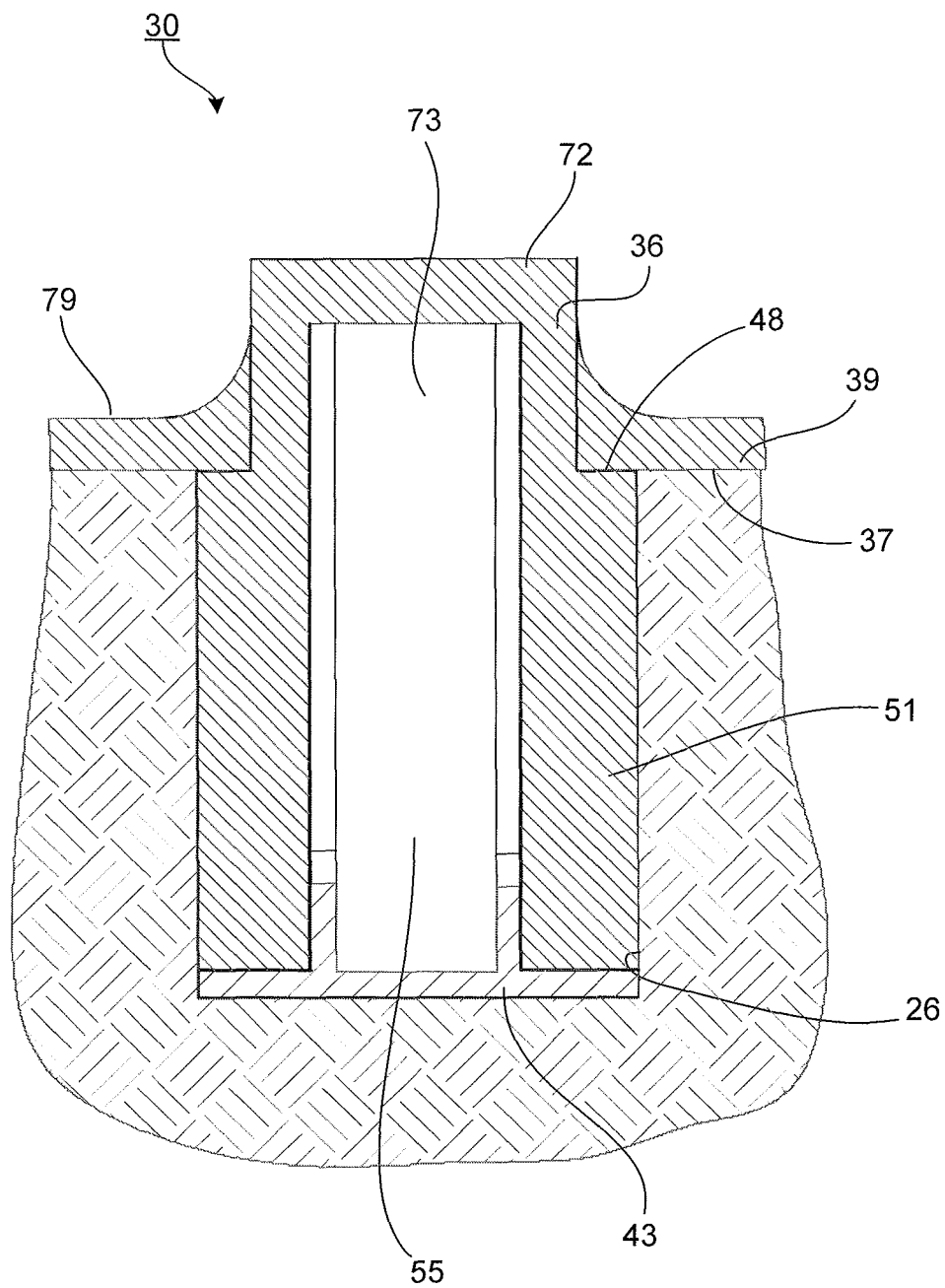
FIG. 29 is a cross section view of the fin socket disposed within a foam core of a surfboard and with fiberglass laminations disposed thereon.

FIG. 29 shows the cross section view of the fin socket 30 disposed within recess 26 and one or more layers of fiberglass laminations 39 have been applied to surface 37 of surfboard 10. As shown, the fiberglass laminations 39 and the saturating resins therein extend continuously from surface 37 across surface 48 and encapsulate the exterior surfaces of recess 73. According to one exemplary fabricated method, fiberglass laminations 39 are carried forward such that a substantial excess of the fiberglass laminations 39 accumulate along the exterior surfaces of the upper surface of the raised flange 34. The function of slot cover wall 72 is to avoid the unwanted deposit of resin material within the fin slot 35 once installation of the fin 20 is performed.

Unlike conventional methods, an advantage of this subject disclosure is that the laminating process may be carried forward with the same ease as if fin 20 were not attached to the surfboard as described using the alignment tool 112 and process described above. Conventionally, working around fins 20 has been a cumbersome and difficult process during the laminating process and in laminating the fins 20 to the surfboard laminations. The subject of this disclosure avoids those conventional disadvantages.

Once the resin within the fiberglass laminations 39 has completely cured, the surface of the surfboard 10 may be sanded. Additionally, the portions of excess resin as well as the portion of recess 73 and slot cover wall 72 extending above the upper surface 79 of laminations 39 are sanded flat to produce a smooth continuous surface and the structure shown in FIG. 30. According to this shape and construction, no sharp edges remain after the areas around the fin socket 30 are sanded.

Figure 30:
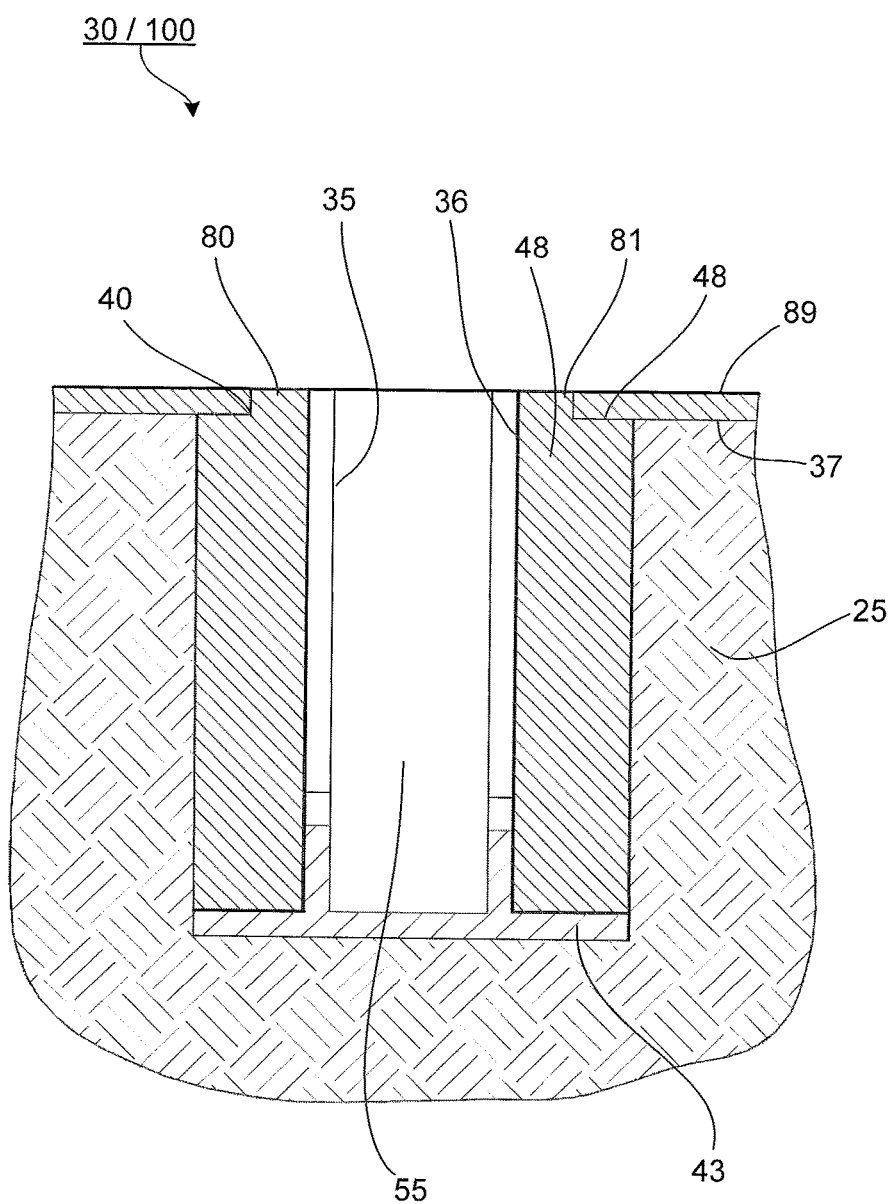
FIG. 30 is a cross section view of the fin socket disposed within a foam core of a surfboard with the slot cover wall open and fiberglass laminations sanded to a predetermined height.

FIG. 30 depicts the completed and installed structure of the fin socket 30 of the fin mount assembly 100 prior to the insertion of the fin base 24 of the fin 20 within the fin slot 35. After the sanding operation, a continuous fiberglass lamination layer 89 is produced which is reduced in thickness from that shown in FIG. 29 but which remains securely bonded to surface 37 of foam core 25 and surface 48 of the socket cover plate 36. With the sanding of the excess portions of recess 73 and lamination 89 and the removal thereby of the slot cover wall 72, the fin slot 35 terminates at its upper extreme in a pair of upwardly extending wall portions 80, 81 which previously formed part of recess 73 and which now form the upper surrounding edge of fin slot 35. According to this subject disclosure, the strength of lamination 39 bonded to the step 40 junction, together with the adhesive bonding of fin socket 30 within recess 26 provide considerable mounting strength for fin socket 30 and securely retain it within foam core 25.

FIG. 31 depicts the final assembly step being carried forward with the attachment of the fin 20 to the slot 35 by inserting the fin base 24 therein. As shown, the post 91 attached to the base 24 of the fin 20 has been inserted into the opening 90 disposed within the elongated recess 55. The opening 90 extends downward into a wall adjacent to the elongated recess 55. The opening 90 is adapted to receive the post 91 connected to a base 24 of the fin 20. The opening 90 is the opening to the track 92 that is adapted to receive the post 91 connected to the base 24 of the fin 20. The opening 90 extends through the lower end 94 of the elongated recess 55 in the socket cover plate 36. As described above, during installation, the post 91 connected to the base 24 of the fin 20 is aligned with the openings 90 and slides through the channel of the track 92 until the base 24 of the fin 20 is properly aligned within the elongated recess 55. FIG. 5 depicts another illustration a cross section location shown on FIG. 15 at cross section G-G in which the base 24 of the fin 20 is properly aligned, and secured within the elongated recess 55.

The attachment may be made in a variety of different ways, such as with a fastener or other suitable attachment mechanism according to this subject disclosure. The resulting structure provides substantial improvements in ease of manufacture and strength of fin mounting without imposing any undue weight upon the surfboard.

The illustrations and examples provided herein are for explanatory purposes and are not intended to limit the scope of the appended claims. It will be recognized by those skilled in the art that changes or modifications may be made to the above described embodiment without departing from the broad inventive concepts of the invention. It is understood therefore that the invention is not limited to the particular embodiment which is described, but is intended to cover all modifications and changes within the scope and spirit of the invention.

What is claimed:

1. A fin mounting assembly, comprising:
    a fin box having an upper end that is substantially closed and a lower end that is open with an outer edge, an elongated recess is disposed substantially central along a first axis of the fin box that is adapted to receive and secure a base of a fin, the fin box having a flange with an outer border and a slot cover wall extending away from the flange along the first axis and positioned over the elongated recess; and
    a cover plate having an outer border, the outer border adapted to be attached to the outer edge of the open lower end of the fin box,
    wherein the flange has a gradually increasing wall height curvature along the first axis, beginning adjacent to the outer edge of the fin box near ends of the elongated recess and a greatest wall height curvature at a flange central portion.

2. The fin mounting assembly recited in claim 1, wherein the slot cover wall has a gradually increasing wall height curvature along the direction of the first axis, beginning at longitudinal ends of the slot cover wall with a greatest wall height curvature at a slot cover wall central portion.

3. The fin mounting assembly recited in claim 1, wherein the flange has a gradually increasing wall height thickness along the direction of the first axis, beginning at longitudinal ends of the flange with a greatest wall height thickness at a flange central portion.

4. The fin mounting assembly recited in claim 1, wherein an upper cover surface of the slot cover wall is located above an upper flange surface of the flange thereby defining a step between the upper cover surface and the upper flange surface.

5. The fin mounting assembly recited in claim 4, wherein when viewed in a planar view orthogonal to the first axis:
    the slot cover wall, has an increasing width thickness beginning at longitudinal ends of the slot cover wall and increases in width with a greatest width at a slot cover central portion, and
    the flange having an inverted shape from the slot cover wall at the step, the flange has a decreasing width thickness beginning at longitudinal ends of the flange and decreases in width with a smallest width at a flange central portion.

6. The fin mounting assembly recited in claim 1, wherein the elongated recess disposed substantially central along the first axis has an opening that substantially bisects the elongated recess that is adapted to receive a fastener connected to the fin, wherein the opening in the elongated recess is a track that receives a post connected to a fin, the track extends through a lower end of the elongated recess.

7. The fin mounting assembly recited in claim 1, wherein an alignment tool for proper positioning of the fin has a projection that engages an alignment opening in the slot cover wall to align the fin box in a predetermined direction.

8. The fin mounting assembly recited in claim 1, wherein the projection has a shape that substantially mimics the dimensions of a base of a fin that is inserted into the elongated recess with a close tolerance to substantially reduce slop for proper positioning of the fin box in a predetermined orientation.

9. A fin mounting assembly, comprising:
    a fin box having an upper end that is substantially closed and a lower end that is open with an outer edge, an elongated recess is disposed substantially central along a first axis of the fin box that is adapted to receive and secure a base of a fin, the upper end of the fin box having a flange with an outer border, the flange comprising:
        a gradually increasing wall height curvature along the first axis, beginning adjacent to the outer edge of the flange and a greatest wall height curvature at a flange central portion; and
        a slot cover wall extending up and away from the flange along the first axis and positioned over the elongated recess, the slot cover wall having an increasing width thickness beginning at the outer edge of the flange that increases in width having a largest width at a slot cover central portion; and
    a cover plate having an outer border adapted to be attached to the outer edge of the fin box.

10. The fin mounting assembly recited in claim 9, wherein the flange has a gradually increasing wall thickness in the direction of the first axis, beginning at longitudinal ends of the flange with a greatest thickness at a flange central portion.

11. The fin mounting assembly recited in claim 9, wherein an alignment tool for the fin has a projection that engages an alignment opening in the slot cover wall to align the fin box in a predetermined direction.

12. The fin mounting assembly recited in claim 11, wherein the alignment tool has dimensions that that substantially mimic the construction of a base of a fin that is inserted into the elongated recess with a close tolerance to substantially reduce slop for proper positioning of the fin box in a predetermined orientation.

13. The fin mounting assembly recited in claim 12, wherein the projection comprises:
   a width that is substantially the same as the width of the alignment openings; and
   a thickness that is substantially the same as the thickness of the fin inserted into the fin slot.

14. The fin mounting assembly recited in claim 13, wherein the projection has a length that is substantially the same as the length of the fin to extend into the elongated recess of the fin socket.

15. A fin mounting assembly, comprising:
   a fin box having an upper end that is substantially closed and a lower end that is open with an outer edge, an elongated recess is disposed substantially central along a first axis of the fin box that is adapted to receive and secure a base of a fin, the upper end of the fin box comprising:
      a flange with an outer border having a wall thickness that gradually increases in a curvature height; and
      a slot cover wall raised above the elongated recess and extending from the flange, the slot cover wall increases in a width along the first axis beginning adjacent to the outer edges of the flange and a greatest width provided at a slot cover central portion,
   wherein a flange width is inversely proportional to the width of the slot cover wall, wherein the flange width decreases in a width along the first axis beginning adjacent to the outer edges of the flange and a smallest width located at a flange central portion; and
   a cover plate having an outer border adapted to be attached to the outer edge of the fin box.

16. The fin mounting assembly recited in claim 15, wherein the slot cover wall has a cover wall thickness that gradually increases in height along the direction of the first axis, beginning at longitudinal ends of the slot cover wall with a greatest height at a slot cover central portion.

17. The fin mounting assembly recited in claim 15, wherein an upper cover surface of the slot cover wall is located above an upper flange surface of the flange thereby defining a step between the upper cover surface and the upper flange surface.

18. The fin mounting assembly recited in claim 15, wherein an alignment tool for the fin has a projection that engages an alignment opening in the slot cover wall to align the fin box in a predetermined direction.

19. The fin mounting assembly recited in claim 18, wherein the alignment tool has dimensions that that substantially mimic the construction of a base of a fin that is inserted into the elongated recess with a close tolerance to substantially reduce slop for proper positioning of the fin box in a predetermined orientation.

20. The fin mounting assembly recited in claim 19, wherein the projection comprises:
   a width that is substantially the same as the width of the alignment openings;
   a thickness that is substantially the same as the thickness of the fin inserted into the fin slot; and
   a length that is substantially the same as the length of the fin to extend into the elongated recess of the fin socket.

\* \* \* \* \*